United States Patent [19]
Aoki et al.

[11] Patent Number: 5,874,784
[45] Date of Patent: *Feb. 23, 1999

[54] SEMICONDUCTOR DEVICE HAVING EXTERNAL CONNECTION TERMINALS PROVIDED ON AN INTERCONNECTION PLATE AND FABRICATION PROCESS THEREFOR

[75] Inventors: Kazumasa Aoki, Tsuyama; Yoshiki Sota, Tenri, both of Japan

[73] Assignee: Sharp Kabushiki Kaisha, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 664,862

[22] Filed: Jun. 17, 1996

[30] Foreign Application Priority Data

Oct. 25, 1995 [JP] Japan ................................. 7-277929

[51] Int. Cl.[6] ........................... H01L 23/48; H01L 23/12; H01L 23/52
[52] U.S. Cl. ......................... 257/787; 257/666; 257/676; 257/737; 257/778; 257/692; 257/738; 257/789; 257/792; 438/124; 361/813
[58] Field of Search ..................... 257/787, 778, 257/786, 676, 737, 734, 680, 738, 693, 692, 666, 788, 789, 792; 29/827; 438/124, 123; 361/813; 174/52.2

[56] References Cited

U.S. PATENT DOCUMENTS

| | | | |
|---|---|---|---|
| 4,907,067 | 3/1990 | Nerryberry | 257/700 |
| 5,087,961 | 2/1992 | Long et al. | 257/701 |
| 5,506,756 | 4/1996 | Heley | 257/778 |
| 5,552,631 | 9/1996 | McCormick | 257/666 |
| 5,581,122 | 12/1996 | Chao et al. | 257/738 |
| 5,592,025 | 1/1997 | Clark et al. | 257/734 |
| 5,625,222 | 4/1997 | Yoneda et al. | 257/787 |
| 5,640,047 | 6/1997 | Nakashima | 257/693 |
| 5,656,550 | 8/1997 | Tsuji et al. | 438/123 |
| 5,663,593 | 9/1997 | Mostafazadeh et al. | 257/666 |
| 5,672,912 | 9/1997 | Hoki et al. | 257/693 |

FOREIGN PATENT DOCUMENTS

| | | |
|---|---|---|
| HEI 5-82586 | of 1993 | Japan . |
| HEI 6-112354 | of 1994 | Japan . |
| HEI 6-504408 | of 1994 | Japan . |
| WO 92/05582 | 2/1992 | WIPO . |

Primary Examiner—Alexander Oscar Williams
Attorney, Agent, or Firm—Nixon & Vanderhye P.C.

[57] ABSTRACT

A semiconductor device includes an interconnection plate, a semiconductor chip having electrodes formed on one surface thereof and bonded to the interconnection plate with the other surface thereof, wires respectively connecting the electrodes of the semiconductor chip and the internal connection regions of the interconnection plate, and a resin sealer sealing therein the semiconductor chip and the wires on the interconnection plate, wherein the internal connection regions are provided in a peripheral area of the interconnection plate surrounding the semiconductor chip, and major portions of the interconnection patterns and the external connection terminals are provided in an area inward from the internal connection regions under the semiconductor chip.

19 Claims, 17 Drawing Sheets

FIG. 11 ( f )
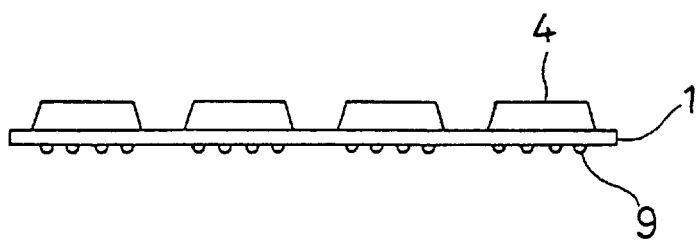
FIG. 11 ( g )
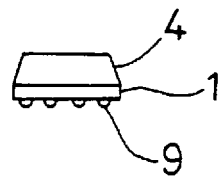

SEMICONDUCTOR DEVICE HAVING EXTERNAL CONNECTION TERMINALS PROVIDED ON AN INTERCONNECTION PLATE AND FABRICATION PROCESS THEREFOR

BACKGROUND OF THE INVENTION

1. Field of the Invention

The present invention relates to a semiconductor device and a fabrication process therefor and, more particularly, to a semiconductor device with a reduced size and to a fabrication process therefor.

2. Description of Related Arts

To meet requirements for high density integration of semiconductor devices on a printed circuit board, the size of the semiconductor devices has been reduced.

FIG. 21 is a schematic diagram illustrating a conventional semiconductor device of the most common construction (hereinafter referred to as "common semiconductor device"). FIG. 22 is a plan view of the common semiconductor device of FIG. 21. As shown, the semiconductor device has a semiconductor chip 32 having electrodes 31, leads 33 serving as external connection terminals, wires 34 respectively connecting the electrodes 31 of the semiconductor chip 32 to the leads 33, and a resin sealer 35.

The electrodes 31 are disposed on a surface of the semiconductor chip 32 formed with circuits (not shown). The resin sealer 35 serves to protect from an exterior environment the semiconductor chip 32, the wires 34 and the circuits formed around regions where the wires 34 are connected to the leads 33. A die pad 36 serves to support the semiconductor chip 32 fixed thereon during a fabrication process for the semiconductor device.

The leads 33 are each formed of a metal material such as an iron-nickel alloy or copper. The wires 34 are each made of a highly conductive metal material such as gold, silver or copper and have a diameter of about 30 um. Exemplary resins for the resin sealer 35 include thermosetting resins such as epoxy resins.

The semiconductor device is fabricated in the following manner. First, the semiconductor chip 32 is fixed onto the die pad 36 with an adhesive such as of a thermosetting resin, and then the electrodes 31 of the semiconductor chip 32 are respectively connected to the leads 33 through the wires 34. Thereafter, the resulting structure is sealed with the sealing resin in a mold, and the leads 33 extending out of the resin sealer 35 are each formed into an external connection terminal having a predetermined configuration. Thus, the semiconductor device is completed.

In the common semiconductor device shown in FIG. 22, ends of the plural leads on the side of the semiconductor chip 32 are disposed in the vicinity of the semiconductor chip 32 in the same plane to surround the semiconductor chip 32. Portions of the leads 33 extend out of the resin sealer 35 in two or four directions and are equidistantly spaced.

Thus, the common semiconductor device has a clearance for connecting the wires 34 to the leads 33 on the lateral sides of the semiconductor chip 32 and a clearance for forming external connection terminals of the leads 33 outside the resin sealer 35.

Meanwhile, semiconductor devices have recently been developed which have a reduced size substantially equivalent to the size of a semiconductor chip incorporated therein. The downsized semiconductor devices, which are referred to as "CSP (chip size package)", are classified into three major types.

FIG. 23 is a schematic diagram illustrating the construction of a conventional downsized semiconductor device of a first type. The semiconductor device of this type has a construction as disclosed in "EIAJ 2nd Surface Mounting Technology Forum '94 Information".

As shown, the semiconductor device basically includes a semiconductor chip 42 having electrodes 41 formed on a surface thereof on a circuit side, leads 43, wires 44 connecting the electrodes 41 to the leads 43, and a resin sealer 45. The semiconductor chip 42 is fixed to the leads 43 by an insulating tape 46. The leads 43 exposed out of the resin sealer 45 serve as external connection terminals 47.

The semiconductor device of the first type is fabricated in the following manner. First, the semiconductor chip 42 is fixed onto the leads 43 by the insulating tape 46, and then the electrodes 41 of the semiconductor chip 42 are respectively connected to the leads 43 through the wires 44. Thereafter, the resulting structure is sealed with a resin in a mold, and portions of the leads 43 extending out of the resin sealer 46 are trimmed. Thus, the semiconductor device is completed.

One feature of the semiconductor device of the first type is that the leads are used as external connection terminals, like the aforesaid common semiconductor device. In the semiconductor device of the first type, ends of the leads 43 are spaced apart from the surface of the semiconductor chip 42 on the circuit side with intervention of the insulating tape 46. Therefore, when viewed from the top thereof, the semiconductor chip 42 overlaps the leads 43.

With this construction, the electrodes 41 of the semiconductor chip 42 are connected to the leads 43 through the wires 44 within a region just below the semiconductor chip 42. Since a clearance around the periphery of the semiconductor chip can be reduced which is otherwise required for the connection of the leads and the electrodes in the case of the common semiconductor device, the semiconductor device of the first type has a reduced size.

Further, portions of the leads 43 extending out of the resin sealer 45 are trimmed on peripheral surfaces of the resin sealer 45 so that the trimmed sections of the leads 43 serve as the external connection terminals 47. Therefore, the portions of the leads extending out of the resin sealer 45 can be eliminated which otherwise serve as the external connection terminals in the common semiconductor device. Thus, the semiconductor device of the first type has a reduced size substantially equivalent to the size of the semiconductor chip 42.

FIG. 24 is a schematic diagram illustrating the construction of a conventional downsized semiconductor device of a second type. The semiconductor device of this type has a construction as disclosed in Japanese Unexamined Patent Publication No. HEI 5(1993)-82586.

As shown, the semiconductor device of the second type basically includes an interconnection member 52 of a substrate formed with through-holes 51, a semiconductor chip 54 having electrodes 53 formed on a surface thereof on a circuit side, and a resin sealer 55.

The interconnection member 52 has metal interconnection patterns 56 formed on an upper surface thereof. The interconnection patterns 56 are respectively provided with internal connection regions 57 for connecting to the corresponding electrode 53 of the semiconductor chip 54. On a lower surface of the interconnection member 52 are formed external connection regions 58 respectively connected to the corresponding interconnection patterns 56 through the throughholes 51. The external connection regions 58 are respectively provided with external connection terminals 59 for mount implementation. The electrodes 53 of the semiconductor chip 54 are respectively formed with bump electrodes 60 for connecting the electrodes 53 to the internal connection regions 57.

The semiconductor device is constructed such that: the surface of the semiconductor chip 54 on the circuit side is brought in contact with the upper surface of the interconnection member 52; the semiconductor chip 54 is sealed with the resin sealer 55; and the external connection terminals 59 are formed on the lower surface of the interconnection member 52.

The interconnection member 52 comprises an insulating substrate such as of a ceramic plate or a polyimide film. The interconnection patterns 56 of a metal film including the internal connection regions 57 are formed on the upper surface of the interconnection member 52 (i.e., on the side brought in contact with the semiconductor chip 54 for the bonding thereof). The external connection regions 58 are formed on the lower surface of the interconnection member 52 (i.e., on the side opposite to the semiconductor chip 54). The interconnection patterns 56 are electrically connected to the corresponding external connection regions 58 through the through-holes 51.

In the semiconductor device, the layout of the internal connection regions 57 correspond to the layout of the electrodes 53 of the semiconductor chip 54 to be connected thereto. The electrodes 53 of the semiconductor chip 54 are respectively connected to the corresponding internal connection regions 57 via the bump electrodes 60 of tin or the like. The external connection terminals 59 are formed as solder bumps or the like on the external connection regions 58 of the interconnection member 52.

The semiconductor device has electric circuits respectively extending from the electrodes 53 of the semiconductor chip 54 through the internal connection regions 57, the interconnection patterns 56 and the external connection regions 58 to the corresponding external connection terminals 59. The periphery of the semiconductor chip 54 on the interconnection member 52 is sealed with the resin sealer 55 for protecting the electric circuits from an exterior environment.

In accordance with this construction, there is no component disposed on the outer peripheral sides of the semiconductor chip 54, and the lateral size of the semiconductor device is defined by the size of the semiconductor chip plus the thickness of the resin sealer 55. Thus, the size of the semiconductor chip can be reduced.

Further, the provision of the interconnection patterns 56 between the electrodes 53 of the semiconductor chip 54 and the external connection terminals 59 permits free layout design of the external connection terminals 59 for standardization of the layout of the external connection terminals 59. This permits the external connection terminals 59 to be arranged in an area array, which is advantageous for a semiconductor chip having a multiplicity of electrodes.

FIG. 25 is a schematic diagram illustrating the construction of a conventional downsized semiconductor device of a third type. The semiconductor device of this type has a construction as disclosed in Japanese Unexamined Patent Publication No. HEI 6(1994)-504408.

As shown, the semiconductor device of the third type basically includes a semiconductor chip 62 having electrodes 61 formed on a surface thereof on a circuit side, an interconnection member 63 of a substrate, wires 64 connecting the electrodes 61 of the semiconductor chip 62 to the interconnection member 63, and a resin sealer 65.

The interconnection member 63 has metal interconnection patterns 66 formed on a lower surface thereof. The interconnection patterns 66 are respectively provided with internal connection regions 67. The electrodes 61 of the semiconductor chip 62 are respectively connected to the corresponding internal connection regions 67 through the wires 64. On the lower surface of the interconnection member 63 are further formed external connection regions 68, which are connected to external connection terminals 69 for mount implementation formed on the resin sealer 65.

The semiconductor device is constructed such that: the interconnection member 63 is bonded to the semiconductor chip 62 on the circuit side (i.e., on a side thereof provided with the electrodes 61) without covering the electrodes 61; and the electrodes 61 of the semiconductor chip 62 are respectively connected to the internal connection regions 67 of the interconnection member 63 through the wires 64.

The interconnection member 63 comprises an insulating substrate such as of a ceramic plate or a polyimide film. The semiconductor chip 62 is bonded onto the upper surface of the interconnection member 63. On the lower surface of the interconnection member 63 are formed the internal connection regions 67, the interconnection patterns 66 and the external connection regions 68 for connecting to external connection terminals 69. One end of each of the interconnection patterns 66 is connected to the corresponding internal connection region 67, and the other end thereof is connected to the corresponding external connection region 68.

The semiconductor device of the third type is fabricated in the following manner. After the interconnection member 63 is bonded to the semiconductor chip 62, the electrodes 61 of the semiconductor chip 62 are respectively connected to the corresponding internal connection regions 67 of the interconnection member 63 through the wires 64, and then the interconnection member 63 and the wires 64 are sealed with the resin sealer 65. In turn, portions of the resin sealer 65 on the external connection regions 68 are removed to expose the external connection regions 68, and then solder or the like is deposited on the exposed external connection regions 68 to form bumps protruding from the resin sealer 65 for the formation of the external connection terminals 69.

The semiconductor device has electric circuits respectively extending from the electrodes 61 of the semiconductor chip 62 through the wires 64, the internal connection regions 67, the interconnection patterns 66 and the external connection regions 68 to the corresponding external connection terminals 69. The external connection terminals 69 are arranged in an area array.

In accordance with this construction, there is no component disposed on the outer peripheral sides of the semiconductor chip 62 and, therefore, the size of the semiconductor device can be reduced. Further, the provision of the interconnection patterns 66 between the electrodes 61 of the semiconductor chip 62 and the external connection terminals 69 permits free layout design of the external connection terminals 69 for standardization of the layout of the external connection terminals 69. This permits the external connection terminals 69 to be arranged in an area array, which is advantageous for a semiconductor chip having a multiplicity of electrodes. In addition, since the connection between the electrodes 61 of the semiconductor chip 62 and the internal connection terminals 67 is achieved by the wires 64, this construction can be applied to a semiconductor chip having a different electrode layout.

FIGS. 26 and 27 illustrate constructions of semiconductor devices employing projection electrodes as external connection terminals. The semiconductor devices have constructions as disclosed in Japanese Unexamined Patent Publication No. HEI 6(1994)-112354. These constructions are referred to as "BGA (bowl grid array)".

The semiconductor device shown in FIG. 26 includes two layers of interconnection patterns, a semiconductor chip 72 having electrodes 71, an interconnection member 74 of a substrate formed with through-holes 73, wires 75 connecting the electrodes 71 of the semiconductor chip 72 to the interconnection member 73, and a resin sealer 76.

Upper interconnection patterns 77 are formed on an upper surface of the interconnection member 74 (i.e., on a surface of the interconnection member 74 on the side of the semiconductor chip 72). The upper interconnection patterns 77 are respectively provided with internal connection regions 78. Lower interconnection patterns 79 are formed on a lower surface of the interconnection member 74 (i.e., on a surface of the interconnection member 74 opposite to the semiconductor chip 72). The lower interconnection patterns 79 are respectively provided with external connection regions 80 on which external connection terminals 81 for mount implementation are formed.

The upper interconnection patterns 77 are formed on a peripheral surface portion of the interconnection member 74 which is not used for bonding the semiconductor chip 72 to the interconnection member 74.

Each of the wires 75 is connected to a corresponding electrode 71 of the semiconductor chip 72 at one end thereof and to an internal connection region 78 of a corresponding upper interconnection pattern 77 at the other end thereof. The through-holes 73 are formed on an outer peripheral surface portion of the interconnection member 74. The upper interconnection patterns 77 are respectively electrically connected to the corresponding lower interconnection patterns 79 through the through-holes 73.

Since the semiconductor device has the two layers of interconnection patterns 77 and 79, the external interconnection terminals 81 can be disposed in any positions on the lower surface of the interconnection member 74 including an area just below the semiconductor chip 72. Therefore, the external connection terminals 81 are arranged in an area array on the entire lower surface of the interconnection member 74 of the semiconductor device.

Although the BGA semiconductor device has a size comparable to a semiconductor device of the aforesaid common construction having the same number of external connection terminals, the external connection terminals thereof are arranged at increased intervals. This is advantageous because the mounting of the semiconductor device does not require a high positioning accuracy.

In such a BGA semiconductor device, external connection terminals each having a diameter of 0.76 mm are typically arranged at intervals of 1.27 mm to 1.5 mm. Where the BGA semiconductor device has 313 external connection terminals and a semiconductor chip of about 10 mm×10 mm, for example, the semiconductor device has a size of about 35 mm×35 mm. In this case, the wire length is about 3.5 mm, and the distance between the periphery of the semiconductor chip and the periphery of the semiconductor device is about 12.5 mm.

The semiconductor device shown in FIG. 27 has a single layer of interconnection patterns. Referring to FIG. 27, an explanation will not be given to components denoted by the same reference numerals as in FIG. 26.

In the semiconductor device, the single-layer interconnection patterns 77 are formed on a peripheral surface portion of an interconnection member 74 which is not used for bonding the semiconductor chip 72 to the interconnection member 74. External connection terminals 81 are disposed in an area of the interconnection member 74 just below the interconnection patterns 77.

Although the semiconductor device has substantially the same construction as the semiconductor device of FIG. 26 having the two layers of interconnection patterns, the external connection terminals 81 are not provided in an area of the interconnection member 74 just below the semiconductor chip 72. In the BGA semiconductor devices shown in FIGS. 26 and 27, the external connection terminals 81 are provided in an area outward from the wire connecting points (internal connection regions 78) of the interconnection member 74.

The conventional semiconductor devices described above, however, suffer from the following problems. The conventional downsized semiconductor device of the first type shown in FIG. 23 uses the leads 43 for deriving the circuits to the external connection terminals 47, and the leads 43 are arranged in rows on the peripheral portion of the resin sealer 45. More specifically, the leads 43 are arranged in two parallel rows, or in four rows surrounding the resin sealer 45.

In such a lead layout, the number of the external connection terminals 47 to be provided on the resin sealer 45 is determined by the peripheral length of the resin sealer 45 and the intervals of the leads 43, like the conventional common semiconductor device. Since the external connection terminals 47 are disposed along the periphery of the resin sealer 45, the size of the semiconductor device is increased with the increase in the number of the external connection terminals.

In the conventional downsized semiconductor device of the second type shown in FIG. 24, the electrodes 53 of the semiconductor chip 54 are connected to the internal connection regions 57 formed on the interconnection member 52 through the tin bumps or the like. The positions of the internal connection regions 57 on the interconnection member 52 should exactly coincide with the positions of the electrodes 53 when the semiconductor chip 54 is mounted on the interconnection member 52.

Therefore, where a semiconductor chip having a different electrode layout is to be used, the same interconnection member 52 is useless. Since the interconnection member 52 cannot be used in common with a plurality of kinds of semiconductor chips, the cost of the semiconductor device is increased.

In the conventional downsized semiconductor device of the third type shown in FIG. 25, the interconnection member 63 is bonded onto the surface of the semiconductor chip 62 formed with the electrodes 61, and the electrodes 61 of the semiconductor chip 62 are connected to the internal connection regions 67 of the interconnection member 63 through the wires 64.

Where the interconnection member 63 is thus disposed on the surface of the semiconductor chip 62 formed with the electrodes 61, a clearance is required above the electrodes 61 of the semiconductor chip 62 for the connection by the wires 64. Therefore, the interconnection member 63 cannot be provided just above the electrodes 61. The external connection terminals 69 of the semiconductor device are respectively provided on the external connection regions 68 formed on the surface of the interconnection member 63. This poses a layout limitation such that the external connection terminals 69 cannot be provided just above the electrodes 61 of the semiconductor chip 62. The internal connection regions 67 and the external connection regions 68 are formed in the same plane on the interconnection member 63. This poses a layout limitation such that the external connection terminals 69 cannot be provided above the internal connection regions 67.

In the semiconductor devices shown in FIGS. 26 and 27, the interconnection patterns 77 are provided on the surface of the interconnection member 74 on the side of the semiconductor chip 72. More specifically, the interconnection patterns 77 are provided on the peripheral surface portion of the interconnection member 74 around the semiconductor chip 72. Therefore, the size of the interconnection member 74 is larger than the size of the semiconductor chip 72 by the area formed with the interconnection patterns 77. This results in an increased size of the resin sealer 76, which is much greater than the size of the semiconductor chip 72. Therefore, it is difficult to provide a CSP semiconductor device in which the size of the resin sealer is substantially equivalent to the size of the semiconductor chip 72.

SUMMARY OF THE INVENTION

In view of the foregoing, the present invention is directed to a semiconductor device of a reduced size in which external connection terminals thereof are provided within an area on an interconnection member thereof which is substantially equivalent to the surface area of the semiconductor chip.

In accordance with the present invention, there is provided a semiconductor device comprising: an interconnection plate including an external insulating layer, a chip-side insulating layer, interconnection patterns provided between the external insulating layer and the chip-side insulating layer, and external connection terminals provided on the external insulating layer and respectively connected to the interconnection patterns, portions of the interconnection patterns being exposed on a side of the chip-side insulating layer to form internal connection regions; a semiconductor chip having electrodes formed on one surface thereof, and bonded to the chip-side insulating layer of the interconnection plate with the other surface thereof; wires respectively connecting the electrodes of the semiconductor chip and the internal connection regions; and a resin sealer sealing therein the semiconductor chip and the wires on the interconnection plate, wherein the internal connection regions are provided in a peripheral area of the interconnection plate surrounding the semiconductor chip, and major portions of the interconnection patterns and the external connection terminals are provided in an area inward from the internal connection regions under the semiconductor chip.

The foregoing and other objects, features and attendant advantages of the present invention will become more readily apparent from the following detailed description of the preferred embodiments. However, it should be understood that the preferred embodiments are only illustrative of the invention, since various changes and modifications can be made within the spirit and scope of the invention as would be apparent to those skilled in the art.

BRIEF DESCRIPTION OF THE DRAWINGS

The present invention will be detailed in conjunction with the accompanying drawings, but the invention is not limited thereto.

FIGS. 11(*f*) and 11(*g*) are diagrams for explaining steps following the resin sealing step of the fabrication process according to the present invention;

DESCRIPTION OF THE PREFERRED EMBODIMENTS

Figure 1:
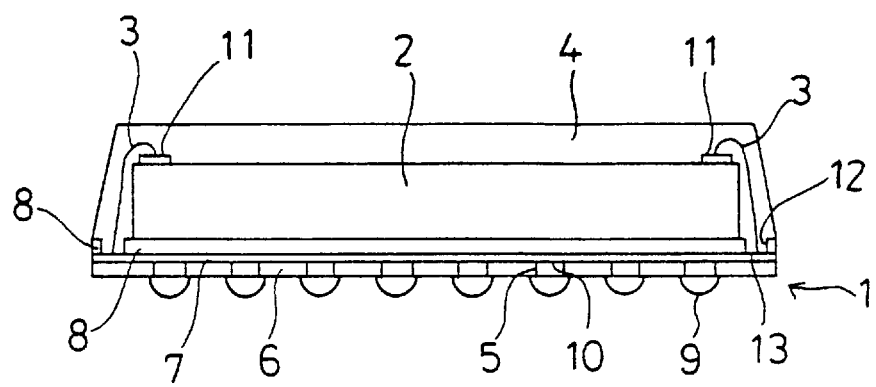
FIG. 1 is a schematic diagram illustrating the construction of a semiconductor device according to Embodiment 1 of the present invention.

The semiconductor device of the present invention is constructed such that: the semiconductor chip is bonded onto the surface of the chip-side insulating layer of the interconnection plate with its electrode-free surface brought in contact with the chip-side insulating layer; the electrodes of the semiconductor chip are connected to the internal connection regions through the wires; the semiconductor chip and the wires are sealed in the resin sealer; and the external connection terminals are formed on a surface of the external insulating layer of the interconnection plate under the semiconductor chip.

The semiconductor device has a conventional BGA structure and the size thereof is reduced in the following manner.

The major portions of the interconnection patterns are disposed within an area under the semiconductor chip. For reduction in the thickness of the semiconductor device and for reduction in the cost thereof, the interconnection patterns are of a single layer, and the interconnection plate has a sandwich structure such that the single-layer interconnection patterns are held between the chip-side insulating layer and the external insulating layer. The internal connection regions (wire bonding points) are formed on the peripheral surface portion of the interconnection plate surrounding the semiconductor chip by exposing portions of the interconnection patterns from the chip-side insulating layer.

The external connection terminals each having a smaller size are arranged at smaller intervals in an area array within an area inward from the internal connection regions of the interconnection plate or within an area the boundary of which is outwardly spaced 1 mm apart from the periphery of the semiconductor chip. The interconnection patterns respectively extend inwardly from the internal connection regions to the corresponding terminal formation points. Thus, the size of the semiconductor device is reduced.

Preferably used as the external insulating layer is an insulating substrate. The insulating substrate is not particularly limited as long as it has an excellent heat resistance, insulation performance, strength and dimensional stability. Exemplary materials for the insulating substrate having such properties include polyimide resins, polyamide resins, BT (bismaleimide triazine) resin, epoxy resins, polyesters, glass epoxy resins, glass polyimide resins and ceramics. Among these materials, the polyimide resins are preferred in terms of cost and workability. The insulating resistance of the polyimide resins is about $5 \times 10^{13} \Omega$.

The interconnection patterns are formed of a conductive and heat-resistant material. Exemplary materials having such properties include metals. In terms of cost, copper (Cu) is preferred.

The resin for the resin sealer is not particularly limited as long as it has an excellent aging resistance, moldability, moisture resistance and heat resistance, but examples thereof include resin mixtures containing an epoxy resin, a silicone resin or a phenol resin as a principal component thereof. In terms of reliability, an epoxy-based resin is preferred.

The external connection terminals are preferably formed as solder bumps. The solder bumps are formed from solder balls or copper balls plated with solder. In terms of cost, the solder balls are preferred.

For the wires, various metal materials having an excellent electrical conductivity may be used. Examples thereof include gold, silver and copper. In terms of electrical conductivity, gold and silver are preferred.

The semiconductor device of the present invention is preferably constructed as follows for the size reduction thereof. The thickness of the semiconductor chip is reduced to reduce the lengths of the wires provided around the semiconductor chip to 1 mm or shorter. Further, the distance between the periphery of the semiconductor chip and the outer periphery of the semiconductor device is reduced to 1 mm or less.

A thermosetting resin is preferably used for the chip-side insulating layer of the interconnection plate so that the semiconductor chip is bonded to the interconnection plate by heating the thermosetting resin.

Any thermosetting resin may be used for the chip-side insulating layer as long as it has an excellent heat resistance, adhesiveness and insulating performance. Exemplary thermosetting resins include epoxy resins and polyimide resins. In terms of heat resistance, the polyimide resins are preferred.

Alternatively, an insulating adhesive may be used for the formation of the chip-side insulating layer of the interconnection plate.

The internal connection regions are preferably formed by removing portions of the chip-side insulating layer in an inverted-wedge shape such that the width of a resulting recess on each of the internal connection regions is gradually narrowed from the bottom to the mouth thereof. Thus, the recess of the inverted-wedge shape is filled with a resin and the fixation of the resin to the interconnection plate can be improved by an anchoring effect.

The external insulating layer of the interconnection plate preferably has small holes which are adapted to release a certain vaporized component(e.g., moisture). Thus, the vaporized component is prevented from expanding at a bonding interface in the interconnection plate.

The interconnection patterns of the interconnection plate are preferably formed within an area inwardly spaced from the periphery of the external insulating layer, so that ends of the interconnection patterns are not exposed on the periphery of the semiconductor device between the resin sealer and the exterior insulating layer.

The materials for the resin sealer and the interconnection plate are properly selected such that the linear expansion coefficient of the resin sealer is proximate to the linear expansion coefficients of the materials for the interconnection plate. Further, it is preferred that the thickness of the resin sealer on the semiconductor chip is substantially the same as the thickness of the interconnection plate.

In accordance with a second aspect of the present invention, there is provided a process for fabricating a semiconductor device, comprising the steps of: forming through-holes in an external insulating layer, then forming interconnection patterns on the external insulating layer, and covering the interconnection patterns with a chip-side insulating layer to prepare an interconnection plate having the interconnection patterns disposed between the chip-side insulating layer and the external insulating layer; exposing portions of the interconnection patterns of the interconnection plate on a peripheral portion of the chip-side insulating layer to form internal connection regions; bonding a semiconductor chip having electrodes formed on one surface thereof to the chip-side insulating layer of the interconnection plate with the other surface of the semiconductor chip brought in contact with a surface portion of the chip-side insulating layer inward from the internal connection regions; respectively connecting the electrodes of the semiconductor chip and the internal connection regions through wires; sealing the semiconductor chip and the wires in a resin on the chip-side insulating layer of the interconnection plate; and forming external connection terminals on terminal formation points of the interconnection patterns exposed through the through-holes of the external insulating layer, wherein major portions of the interconnection patterns and the external connection terminals are provided within an area inward from the internal connection regions under the semiconductor chip.

In accordance with a third aspect of the present invention, there is provided a process for fabricating a semiconductor device, comprising the steps of: forming windows in a peripheral portion of a chip-side insulating layer, then forming interconnection patterns on the chip-side insulating layer, and covering with an external insulating layer the interconnection patterns except terminal formation points on which external connection terminals are to be formed, to prepare an interconnection plate having the interconnection patterns between the chip-side insulating layer and the external insulating layer; allowing portions of the interconnection patterns of the interconnection plate exposed through the windows of the chipside insulating layer to serve as internal connection regions; bonding a semiconductor chip having electrodes formed on one surface thereof to the chip-side insulating layer with the other surface of the semiconductor chip inward from the windows formed therein; respectively connecting the electrodes of the semiconductor chip and the internal connection regions through wires; sealing the semiconductor chip and the wires in a resin on the chip-side insulating layer of the interconnection plate; and forming external connection terminals on the terminal formation points exposed from the external insulating layer of the interconnection plate, wherein major portions of the interconnection patterns and the external connection terminals are provided within an area inward from the internal connection regions under the semiconductor chip.

In the fabrication process according to the present invention, the parting face of a metal mold for sealing is preferably prevented from overhanging the internal connection regions when the interconnection plate is set in the mold for the sealing of the semiconductor chip and the wires in the resin.

In the semiconductor device according to the present invention, the internal connection regions are formed on the peripheral portion of the interconnection plate around the semiconductor chip, and the major portions of the interconnection patterns and the external connection terminals are formed in an area of the interconnection plate inward from the internal connection regions. Therefore, the major portions of the interconnection patterns and the external connection terminals are disposed under the semiconductor chip, so that the interconnection plate has a size substantially equivalent to the size of the semiconductor chip. Thus, the semiconductor device has a CSP (chip size package) structure such that the dimensions of the resin sealer are substantially equivalent to the dimensions of the semiconductor chip. Since the interconnection patterns are of a single layer, the semiconductor device has a reduced thickness. In addition, the fabrication cost can be reduced.

In the semiconductor device according to the present invention, the major portions of the interconnection patterns are formed under the semiconductor chip, and the external connection terminals each having a smaller size are arranged at smaller intervals within an area inward from the internal connection regions of the interconnection plate or within an area the boundary of which is outwardly spaced 1 mm apart from the periphery of the semiconductor chip. Therefore, there exists only a wire connection area on the peripheral portion of the interconnection plate around the semiconductor chip.

Further, the wire connection area formed around the semiconductor chip can be minimized by employing a semiconductor chip of a minimum thickness to reduce the lengths of the wires. Since the electrodes of the semiconductor chip are connected to the internal connection regions of the interconnection plate through the wires, the external connection terminals can be provided in any desired positions of the interconnection plate. Thus, the external connection terminals can be arranged in an area array. Therefore, the semiconductor device of the present invention has an ideal construction such that the external connection terminals can be formed in any desired positions within a terminal formation area of the interconnection plate.

Where the chip-side insulating layer of a thermosetting resin is used for the bonding of the semiconductor chip to the interconnection plate, a thermosetting resin adhesive used in the prior art is not required. Thus, the thickness of the resulting semiconductor device can be reduced.

Where the internal connection regions are formed by removing portions of the chip-side insulating layer in an inverted-wedge shape such that the side walls of a resulting recess on each of the internal connection regions are inclined. Thus, the fixation of the resin to the interconnection plate can be improved by an anchoring effect.

Where the external insulating layer of the interconnection plate has the small holes, a certain vaporized component can be released from the holes so that the vaporized component is prevented from expanding at the bonding interface in the interconnection plate.

Where the interconnection patterns of the interconnection plate are formed within an area inwardly spaced from the periphery of the external insulating layer, the ends of the interconnection patterns are not exposed on the periphery of the semiconductor device between the resin sealer and the exterior insulating layer, so that a boundary between the interconnection patterns and the resin sealer does not appear on the periphery of the resin sealer. Thus, the sealability by the resin sealer can be improved.

Where the materials for the resin sealer and the interconnection plate are properly selected such that the linear expansion coefficient of the resin sealer is proximate to the linear expansion coefficients of the materials for the interconnection plate and the thickness of the resin sealer is substantially the same as the thickness of the interconnection plate, the warpage of the semiconductor device can be reduced.

In the fabrication process according to the present invention, the interconnection plate is set in the mold for resin sealing in such a manner that the parting face of the mold does not overhang the internal connection regions when the semiconductor chip and the wires are to be sealed in the resin. Thus, no gap is formed below the parting face of the mold, thereby preventing the production of resin dust.

Therefore, the fabrication process is free from the production of the resin dust and the like.

EMBODIMENTS

The present invention will hereinafter be described in detail by way of Embodiments 1 to 9 illustrated in the attached drawings. However, it should be noted that the invention is no way limited to these Embodiments.

Embodiment 1

Figure 2:
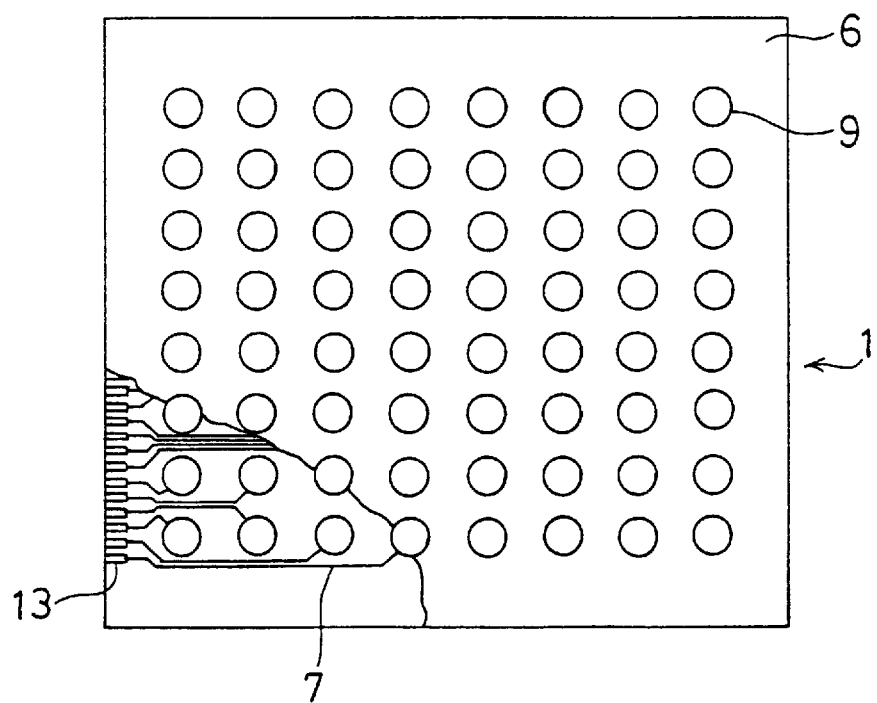
FIG. 2 is a partially fragmentary plan view of the semiconductor device of FIG. 1 as viewed from a lower side thereof.

FIG. 1 is a schematic diagram illustrating the construction of a semiconductor device according to Embodiment 1 of the present invention. FIG. 2 is a partially fragmentary plan view of the semiconductor device of FIG. 1 as viewed from a lower side thereof.

As shown, the semiconductor device includes an interconnection member 1 serving as the interconnection plate, a semiconductor chip 2 bonded to the interconnection member 1, wires 3 connecting the semiconductor chip 2 to the interconnection member 1, and a resin sealer 4 sealing therein the semiconductor chip 2 and the wires 3.

The interconnection member 1 includes an insulating substrate 6 serving as the external insulating layer, an insulator 8 serving as the chip-side insulating layer, and interconnection patterns 7 of a metal such as Cu disposed between the insulating substrate 6 and the insulator 8.

More specifically, the interconnection patterns 7 are formed on an upper surface of the insulating substrate 6 formed with through-holes 5, and the insulator 8 is provided on the interconnection patterns 7. Thus, the interconnection member 1 basically has a sandwich structure such that the interconnection patterns 7 are held between the insulating substrate 6 and the insulator 8.

External connection terminals 9 are provided on a lower surface of the substrate 6. The interconnection patterns 7 are respectively provided with external connection regions 10 which serve as the terminal formation points for respectively connecting the external connection terminals 9 to the corresponding interconnection patterns 7 through the through-holes 5.

The external connection terminals 9 are formed as solder bumps on the external connection regions 10 by bonding thereto solder balls wholly formed of a solder. The external connection regions 10 formed at ends of the interconnection patterns 7 are exposed through the through-holes 5 before the formation of the solder bumps.

The semiconductor chip 2 has electrodes 11 formed on one surface thereof. The semiconductor chip 2 is bonded to the insulator 8 of the interconnection member 1 with the other surface thereof brought in contact with the insulator 8. Windows 12 are formed on a peripheral portion of the insulator 8 around the semiconductor chip 2.

The formation of the windows 12 is achieved by removing parts of the insulator 8. Portions of the interconnection patterns 7 exposed from the windows 12 serve as internal connection regions 13. The electrodes 11 of the semiconductor chip 2 are respectively connected to the corresponding internal connection regions 13 of the interconnection patterns 7 through the wires 3.

Surfaces of the internal connection regions 13 of the interconnection member 1 are Au-plated in a thickness of several tenths micrometers for improved connection thereof to the wires 3. A Ni or Pd film having a thickness of 5 $\mu$m is interposed between the Au plating and the interconnection patterns 7 made of Cu to prevent the alloying of Au and Cu. Such a plating layer may be formed on the exterior connection regions 10 of the interconnection member 1.

The plating can be achieved by an electroless plating or an electrolytic plating. The electroless plating is more preferable because the electrolytic plating requires a specific wiring for the plating.

The through-holes 5 of the substrate 6 and major portions of the interconnection patterns are located in an area inward from the internal connection regions 13 formed on the peripheral region of the substrate 6.

Used as the wires 3 is flexible fine wires each having a diameter of several dozens of micrometers and made of a highly conductive metal such as gold, silver or copper. Used as the insulator 8 is a polyimide film having a thickness of about 70 $\mu$m. Used as the interconnection patterns 7 is a metal film such as of copper (Cu) having a thickness of about 20 $\mu$m. An adhesive having a thickness of about 10 $\mu$m is applied on the interconnection patterns 7 to form an adhesive layer (not shown) for bonding the insulator 8 to interconnection patterns 7.

Therefore, the total thickness of the interconnection pattern 7 and the adhesive layer is about 30 $\mu$m. The substrate 6 is a polyimide insulating substrate having a thickness of about 25 $\mu$m. The insulating resistance of the polyimide insulating substrate is about $5\times10^{13}\Omega$. The resin sealer 4 is formed of an epoxy resin which is highly reliable as a sealing material.

Figure 3:
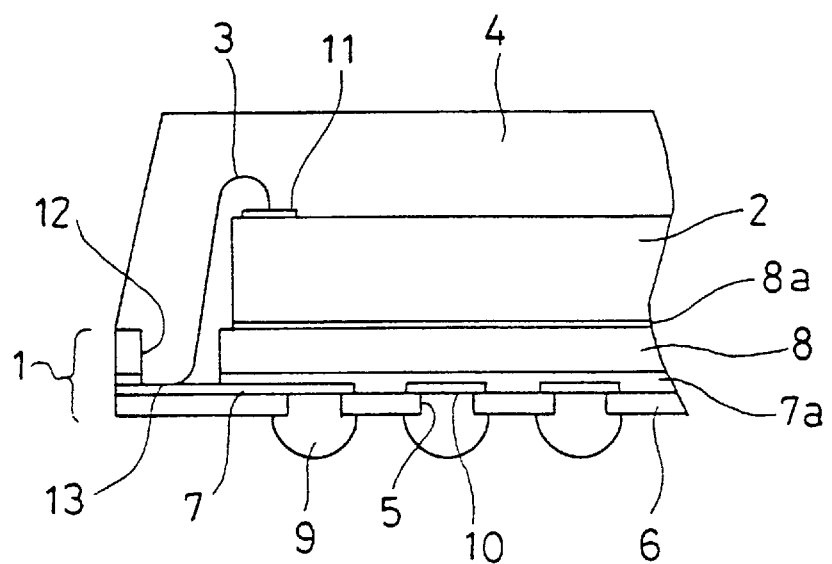
FIG. 3 is a detailed partial view of FIG. 1.

FIG. 3 is a detailed partial view of FIG. 1.

As shown, the interconnection member 1 includes the interconnection patterns 7 formed on the substrate 6 and the insulator 8 bonded onto the interconnection patterns 7 with the adhesive layer 7a. The semiconductor chip 2 is bonded to the interconnection member 1 with a die-bonding adhesive 8a.

Although the substrate 6 and insulator 8 of the interconnection member 1 are formed of a polyimide resin in this embodiment, different resins may be used as the materials therefor, or resins other than the polyimide resin may be used.

Although the interconnection patterns 7 are formed directly on the substrate 6 in this embodiment, the interconnection patterns may be formed thereon with intervention of an adhesive layer. Alternatively, the interconnection patterns 7 may first be formed on the insulator 8 as will be described later. In such a case, the substrate 6 is bonded to the interconnection patterns with the adhesive layer, and then the through-holes for the connection to the external connection terminals 9 are formed in the substrate 6 and the adhesive layer.

As described above, the semiconductor device of this embodiment uses the interconnection member 1 having the insulating members formed on the upper and lower surfaces of the single-layer interconnection patterns 7. The semiconductor chip 2 is bonded to the interconnection member 1 with its electrode-free surface brought in contact with the interconnection member 1. The electrodes 11 of the semiconductor chip 2 are connected to the internal connection regions 13 of the interconnection member 1 through the wires 3, and the semiconductor chip 2 and the wires are sealed with a resin. The external connection terminals 9 (solder bumps) are arranged in an area array on the surface of the interconnection member 1 opposite to the semiconductor chip 2.

Since the external connection regions do not have to be located in the same plane as the internal connection regions of the interconnection member 1 in this construction, no limitation is posed on the layout of the external connection terminals 9.

The electrodes 11 of the semiconductor chip 2 are connected to the internal connection regions 13 of the interconnection member 1 through the wires 3. Therefore, this construction can be applied to a semiconductor chip having a different electrode layout. Further, since the external connection terminals 9 are arranged in an area array, this construction can be applied to a semiconductor chip having a multiplicity of electrodes without increasing the size of the semiconductor device. Therefore, this construction is ideal.

In the semiconductor device according to this embodiment, the interconnection patterns 7 of the interconnection member 1 are provided below the semiconductor chip 2, and the external connection terminals 9 are provided in an area inward from the internal connection regions 13 of the interconnection member 1. This construction allows the semiconductor device to have a size substantially equivalent to the size of the semiconductor chip, thereby realizing the size reduction of the semiconductor device.

In this embodiment, the semiconductor chip 2 has a size of 10 mm×12 mm, and 64 external connection terminals 9 each having a diameter of 0.6 mmφ are arranged at intervals of 1.27 mm. All the external connection terminals 9 are arranged within an area of the interconnection member 1 under the semiconductor chip 2. The size of the semiconductor device can be reduced by employing a thinner semiconductor chip to reduce the lengths of the wires.

Figure 4:
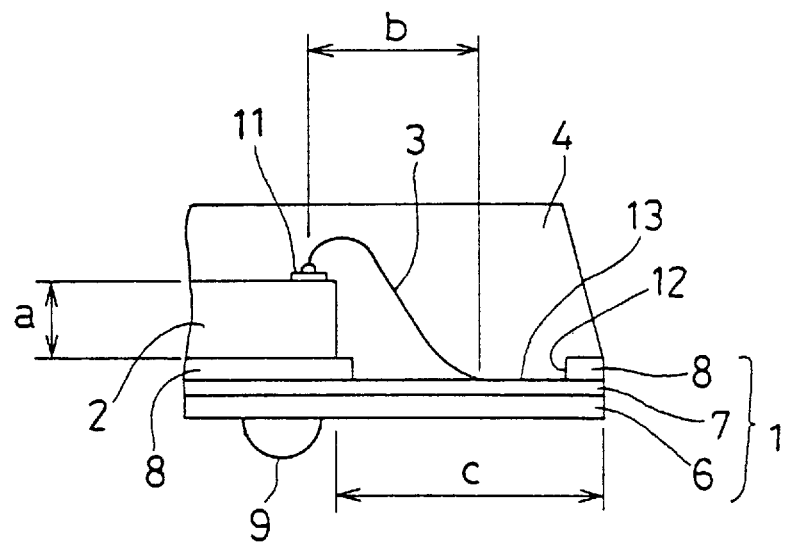
FIG. 4 is a detailed partial view illustrating a portion around a wire connection according to Embodiment 1.

FIG. 4 is a detailed partial view illustrating a portion around a wire connection according to Embodiment 1.

As shown, a length b is defined as a projected length of the wire 3 when viewed from the top, and depends on a level difference between opposite ends of the wire 3 or the thickness a of the semiconductor chip 2. Therefore, the length of the wire 3 can be reduced by reducing the thickness a of the semiconductor chip 2.

In this embodiment, the thickness of the semiconductor chip 2 is 0.2 mm and the lengths of the wires are about 0.5 mm. In this case, the distance c between a side wall of the semiconductor chip 2 and the periphery of the resin sealer 4 is 1.0 mm or less.

To ensure the reliability of the semiconductor device, the fixation of the resin sealer 4 to the insulator 8 and the internal connection regions 13 around the wire connection shown in FIG. 4 should be enhanced. For the enhancement of the fixation, either or both of the following two methods will be taken.

A first method is to activate the surfaces of the insulator 8 and the internal connection regions 13 to be brought in contact with the resin sealer 4 by way of UV radiation or the like to improve the fixation of the resin sealer 4 thereto.

Figure 5:
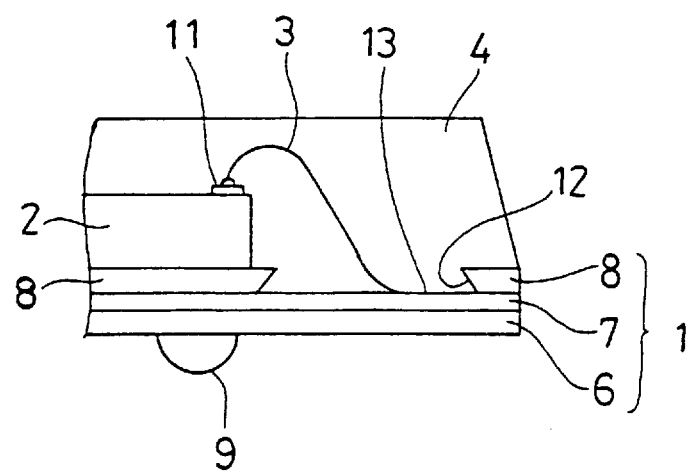
FIG. 5 is a partial view illustrating a window of an interconnection member according to Embodiment 1.

A second method is to form a wedge-shaped window 12 in the interconnection member 1 as shown in FIG. 5 to provide an anchoring effect.

The interconnection member 1 is constructed such that the interconnection patterns 7 are held between the insulating substrate 6 and the insulator 8, and bonded thereto with the adhesive. If the adhesion of the interconnection patterns 7 to the substrate 6 or to the insulator 8 is insufficient, moisture or the like may be accumulated at a bonding interface, and evaporate to expand during a reflow process, causing the interconnection patterns 7 to be separated from the substrate 6 or the insulator 8.

Figure 6:
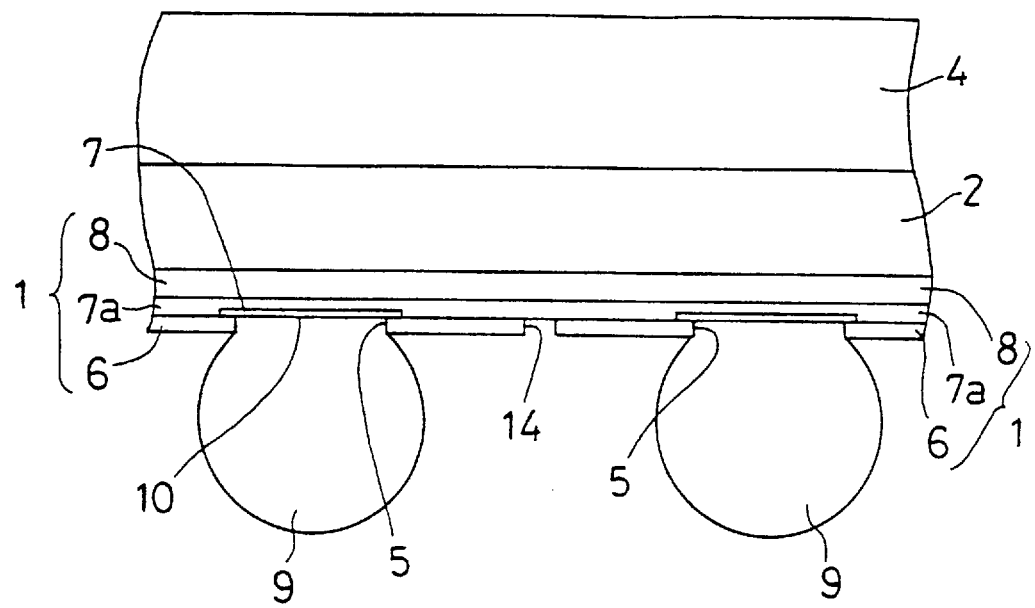
FIG. 6 is a detailed partial view illustrating external connection terminals according to Embodiment 1.

The separation of the interconnection patterns 7 can be prevented in the following manner. Small holes 14 are formed in the substrate 6 which is disposed on the side of the interconnection member 1 formed with the solder bumps or the interconnection terminals 9 as shown in FIG. 6. Thus, the moisture and the like accumulated at the bonding interface can be released through the holes 14, and prevented from remaining therein.

There will next be described a process for fabricating the semiconductor device according to Embodiment 1. FIGS. 7(a) to 7(e) illustrate the fabrication process.

Figure 7A:
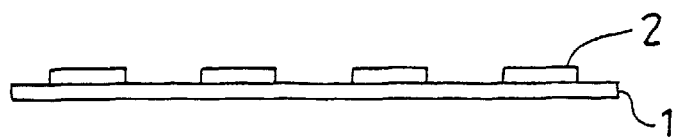
FIGS. 7(*a*) to 7(*e*) are diagrams for explaining a process for fabricating a semiconductor device according to the present invention.

In the fabrication process, the semiconductor chip 2 is first bonded to the interconnection member 1 in a predetermined position thereof (see FIG. 7(a)). It should be noted that a plurality of semiconductor chips 2 are herein bonded to interconnection members 1 integrated in a one-piece frame, but the semiconductor chips 2 may respectively be bonded to separate interconnection members 1.

Figure 8:
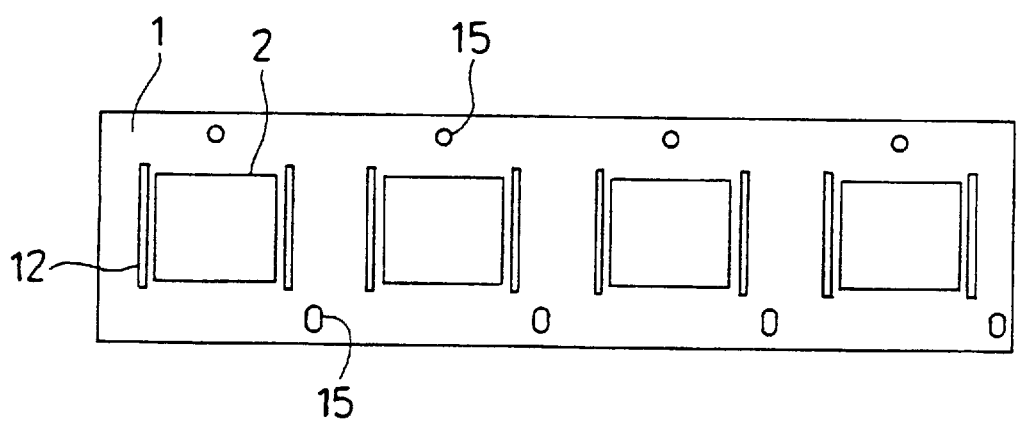
FIG. 8 is a plan view illustrating a state where a plurality of semiconductor chips are bonded to an interconnection member in the fabrication process according to the present invention.

FIG. 8 is a plan view illustrating a state where the semiconductor chips 2 are bonded to the one-piece frame of the interconnection members 1. As shown, the internal connection regions 13 of the interconnection patterns 7 are exposed through the windows 12 of the insulator 8.

The one-piece frame of the interconnection members 1 is formed with through-holes 15, which are used for the transportation or positioning of incomplete products during the fabrication process.

A die-bonding adhesive 8a of a thermosetting resin is used for the bonding of the semiconductor chip 2 to the interconnection member 1. An exemplary thermosetting resin is an epoxy resin which is conventionally used as a die-bonding adhesive. The bonding of the semiconductor chip 2 is achieved by a conventional method in which the semiconductor chip 2 and the interconnection member 1 are combined together with the thermosetting resin interposed therebetween and then subjected to a heating (reflow) process to cure the thermosetting resin.

Figure 7B:
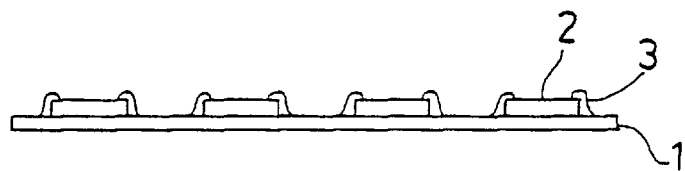

In turn, the electrodes 11 of the semiconductor chip 2 are connected to the internal connection regions 13 of the interconnection member 1 through the wires 3 (see FIG. 7(b)). Used as the wires 3 are flexible fine wires each having a diameter of several dozens micrometers and made of a metal such as gold, silver or copper (which are conventionally used as wires for semiconductor devices). The bonding of the wires is achieved by a conventional method called "wire bonding".

More specifically, an end portion of each wire 3 is fused into a spherical shape by electric spark by means of a wirebonding apparatus, and the spherical end portion of the wire 3 is pressed against an electrode 11 of the semiconductor chip 2 so as to be bonded thereto. Then, the wire 3 is led to an internal connection region 13 of the interconnection member 1 by means of a tool, and a portion of the wire 3 is pressed against and bonded to the internal connection region 13, and then cut. Exemplary wire-bonding methods include thermocompressive bonding, ultrasonic compressive bonding and thermo-ultrasonic-compressive bonding.

Figure 7C:

Subsequently, the semiconductor chip 2, the wires 3 and the internal connection regions 13 are sealed with a resin to form the resin sealer 4 (see FIG. 7(c)). Although a metal mold is used for the resin sealing in this embodiment, a sealing method using no mold may be employed. Used as the resin for the sealing is a thermosetting resin such as an epoxy resin.

For the sealing in the resin sealer 4, the incomplete products are set in a metal mold, into which a molten resin is injected, and then the injected resin is allowed to stand under pressure and heat for the curing thereof. Products obtained after the resin sealing are shown in FIG. 7(c).

Figure 9:
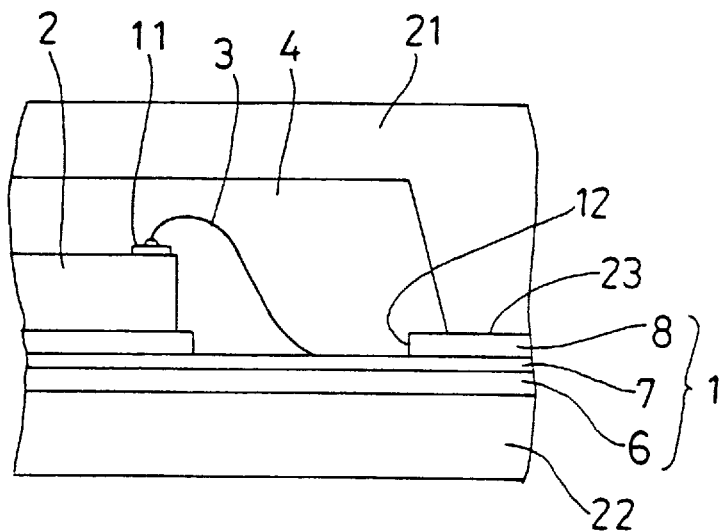
FIG. 9 is a partial view illustrating a state where an incomplete semiconductor device is set in a mold in a resin sealing step of the fabrication process according to the present invention.

The resin sealing step of the fabrication process according to the present invention has the following features. FIG. 9 illustrates a state where an incomplete product is set in a metal mold. In FIG. 9, there are shown an upper mold half 21, a lower mold half 22, and a parting face 23 at which the upper mold half 21 is pressed against the incomplete product.

Figure 10:
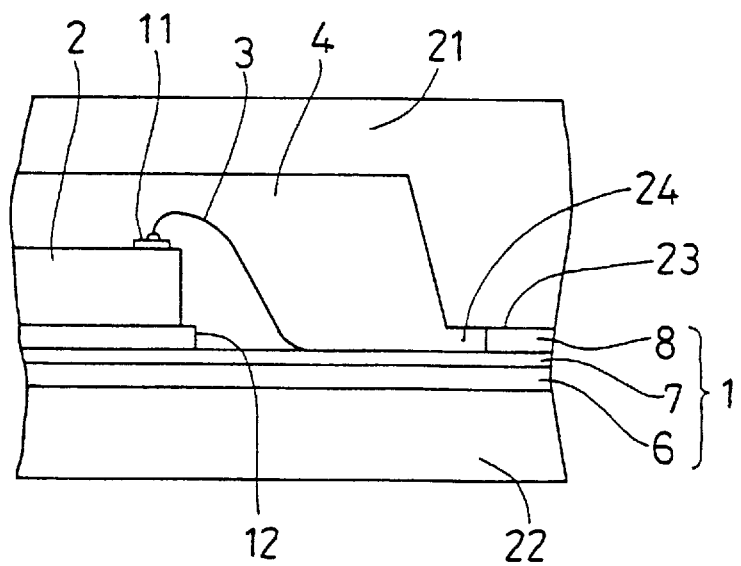
FIG. 10 is a partial view illustrating a state where an incomplete semiconductor device is set in a mold with a portion of a parting face of the mold not abutting against an insulator in the resin sealing step of the fabrication process according to the present invention.

As shown in FIG. 9, the entire parting face 23 abuts against the insulator 8. In a certain case, however, a portion of the parting face may not abut against the insulator 8 as shown in FIG. 10. If the parting face does not entirely abut against the insulator 8, a gap 24 is formed below the parting face 23. Where the resin is injected into the mold in this state, the injected resin enters the gap, and a burr remains on the periphery of the product when the product is taken out of the mold after the resin sealing. The burr is trimmed along with an unnecessary portion of the interconnection member 1 in the subsequent step. However, the trimmed burr may remain as dust on the production line to interfere with the operation of the production line. Therefore, it is desirable that the entire parting face 23 of the upper mold half 21 abuts against the insulator 8.

Figure 7D:

The unnecessary portion of the interconnection member 1 is trimmed as shown in FIG. 7(d) in which only one incomplete product is shown. The interconnection member 1 is cut along the periphery of the resin sealer 4.

Figure 7E:
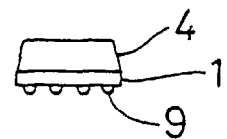

In turn, solder bumps are formed on the external connection regions 10 exposed through the through-holes 5 of the substrate 6 to form the external connection terminals 9 (see FIG. 7(e)). The formation of the external connection terminals 9 (solder bumps) is achieved by first applying a flux on the external connection regions 10, then putting solder balls thereon, and heating the incomplete product in a reflow furnace to bond the solder balls thereon.

Alternatively, the formation of the external connection terminals 9 (solder bumps) may be achieved by putting a paste or sheet solder on the external connection regions 10, then fusing and bonding the solder thereon in a reflow furnace, and shaping the fused solder into bumps.

As shown in FIG. 11, the formation of the external connection terminals 9 may precede the trimming of the interconnection member 1 after the resin sealing step. In this case, the external connection terminals 9 are formed on the one-piece frame of the interconnection members 1 (see FIG. 11(f)), and then the unnecessary portions of the interconnection members 1 are trimmed (see FIG. 11(g)).

The step of bonding the semiconductor chip 2, the step of wire-bonding between the electrodes 11 of the semiconductor chip 2 and the internal connection regions 13 of the interconnection patterns 7, and the step of resin sealing are all performed under heat and pressure before the formation of the solder bumps on the substrate 6 of the interconnection member 1. This is because the presence of the solder bumps makes it difficult to stably fix the substrate 6 during the heat and press process. Further, remelting or deformation of the solder bumps can be prevented.

Warpage of the semiconductor device should be minimized because the warpage makes it difficult to ensure reliable mount implementation. The measures against the warpage are as follows. The materials for the resin sealer and the interconnection member 1 are properly selected such that the linear expansion coefficient of the resin is proximate to the linear expansion coefficients of the materials for the interconnection member 1. The thickness of the resin on the semiconductor chip 2 is controlled to be substantially equivalent to the thickness of the interconnection member 1. Thus, the warpage of the semiconductor device can be minimized.

Embodiment 2

Figure 12:
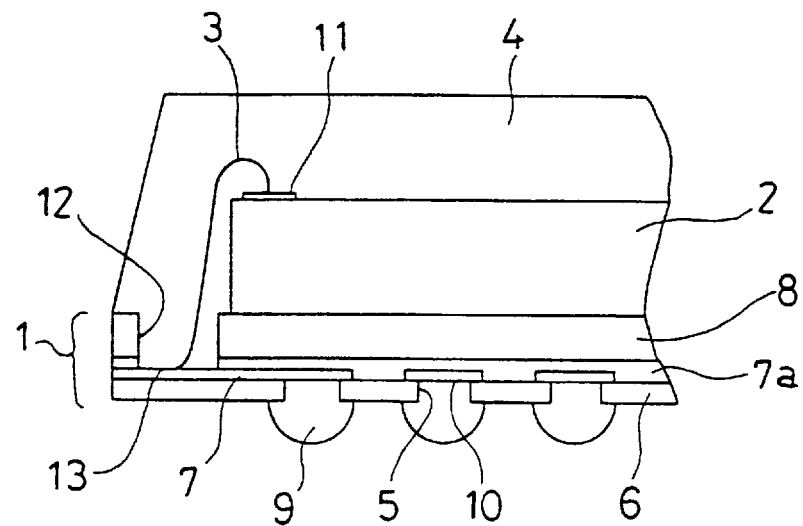
FIG. 12 is a detailed partial view illustrating the construction of a semiconductor device according to Embodiment 2 of the present invention.

FIG. 12 is a detailed partial view illustrating the construction of a semiconductor device according to Embodiment 2 of the present invention.

Although the die-bonding adhesive layer 8a is used to bond the semiconductor chip 2 to the interconnection member 1 in Embodiment 1, this embodiment does not employ the die-bonding adhesive layer 8a but allows the insulator 8 itself to serve as an adhesive as shown in FIG. 12. The semiconductor device of Embodiment 2 has substantially the same construction as in Embodiment 1 except the aforesaid point.

More specifically, the semiconductor chip 2 is bonded to the interconnection member 1 with the insulator 8 formed on the interconnection member 1. An exemplary material for the insulator 8 is a thermosetting polyimide resin. In Embodiment 2, at least a portion of the insulator 8 of the interconnection member 1 to be brought in contact with the semiconductor chip 2 is formed of the thermosetting polyimide resin. The polyimide resin preferably exhibits an excellent workability when the semiconductor chip 2 is bonded to the interconnection member 1, and offers a high reliability when the semiconductor device is subjected to a reflow process for mount implementation.

In a process for fabricating the semiconductor device using this interconnection member 1, the semiconductor chip 2 is bonded to the interconnection member 1 by heating the insulator 8 of the thermosetting polyimide resin. Therefore, the fabrication process according to Embodiment 2 is substantially the same as in Embodiment 1, except that the step of bonding the semiconductor chip 2 to the interconnection member 1 is different.

Since the semiconductor chip 2 is bonded to the interconnection member 1 with the insulator 8, the adhesive is not required. Thus, a level difference between the electrodes 11 of the semiconductor chip 2 and the internal connection regions 13 of the interconnection member 1 can be reduced, thereby reducing the lengths of the wires 3.

Embodiment 3

Figure 13:
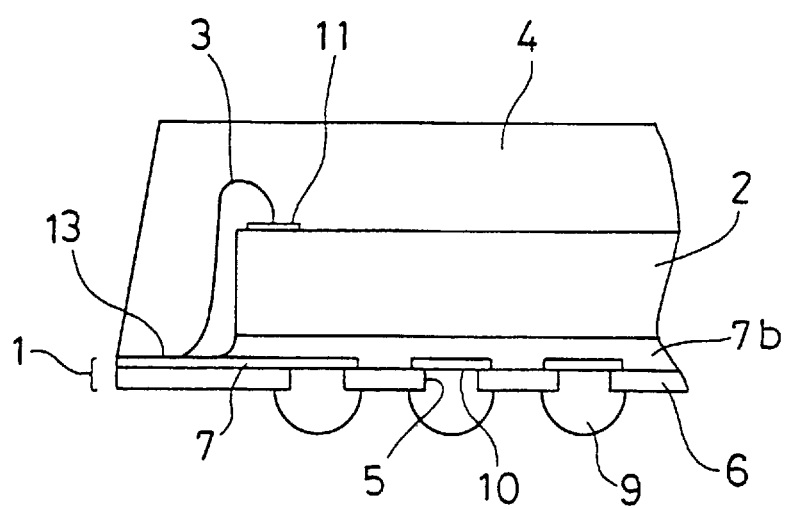
FIG. 13 is a detailed partial view illustrating the construction of a semiconductor device according to Embodiment 3 of the present invention.

FIG. 13 is a detailed partial view illustrating the construction of a semiconductor device according to Embodiment 3 of the present invention.

Although the insulator 8 is bonded to the substrate 6 formed with the interconnection patterns 7 with the adhesive layer 7a and the semiconductor chip 2 is bonded to the insulator 8 with the die-bonding adhesive layer 8a in Embodiment 1, this embodiment does not employ the adhesive layer 7a, the insulator 8 and the die-bonding adhesive layer 8a, but instead employs an insulating resin layer 7b which serves as both an adhesive and an insulator. The semiconductor device of Embodiment 3 has substantially the same construction as in Embodiment 1 except the aforesaid point.

In this embodiment, the interconnection member 1 includes the interconnection patterns 7 formed on the substrate 6 in an exposed state. The interconnection member 1 include neither the insulator 8 formed on the side thereof to be bonded to the semiconductor chip 2 nor the adhesive layer 7a for bonding the insulator 8 to the interconnection patterns 7, both of which are used in Embodiment 1.

Further, it is not necessary to provide the windows 12 for exposing the internal connection regions 13 of the interconnection patterns 7 which are required in Embodiment 1, because the internal connection regions 13 of the interconnection patterns 7 around the semiconductor chip 2 are already exposed.

A thermosetting polyimide resin adhesive in a sheet or paste form is used for the formation of the insulating resin layer 7b. The substrate 6 is formed of a polyimide resin, but resins other than polyimide may be used. Although the interconnection patterns 7 are formed directly on the substrate 6 in the interconnection member 1 as shown in FIG. 13, an adhesive layer may be interposed between the interconnection patterns 7 and the substrate 6.

There will next be described a process for fabricating the semiconductor device according to this embodiment.

To prepare the interconnection member 1, a plurality of metal interconnection patterns 7 are formed on a surface of the substrate 6. The interconnection patterns 7 are each formed with an internal connection region 13 at one end thereof, and with an external connection region 10 at the other end thereof.

Used as the substrate 6 is a polyimide plate having a thickness of about 25 μm. The interconnection patterns 7 are of a metal film of copper (Cu) having a thickness of about 20 μm. The external connection regions 10 of the interconnection patterns 7 are located at positions of the through-holes 5 formed in the substrate 6. Although the interconnection patterns 7 are formed directly on the substrate 6 in the interconnection member 1 shown in FIG. 13, an adhesive layer may be interposed between the substrate 6 and the interconnection patterns 7. Thus, the interconnection member 1 is prepared.

In turn, the semiconductor chip 2 is bonded onto the interconnection patterns 7 of the interconnection member 1 with the insulating resin layer 7b. As described above, the thermosetting polyimide resin adhesive in a sheet or paste form is used for the insulating resin layer 7b.

Since the semiconductor chip 2 is mounted on the bare interconnection patterns 7, it is necessary to prevent the electrical continuity between the interconnection patterns 7 and the bonding surface of the semiconductor chip 2. If the thermosetting polyimide adhesive paste fails to spread over the entire surface of the bonding surface, there is a danger that the interconnection patterns 7 directly contact the semiconductor chip 2. Therefore, the thermosetting polyimide adhesive sheet is more preferable. Of course, conductive adhesives cannot be used for the insulating resin layer 7b.

The bonding of the semiconductor chip 2 to the interconnection patterns 7 is achieved by first placing the semiconductor chip 2 on the interconnection member 1 with intervention of the insulating resin layer 7b of the thermosetting polyimide adhesive sheet having a thickness of about 25 μm, and heating the resulting interconnection member 1 to melt and then cure the thermosetting polyimide adhesive. Thereafter, the electrodes 11 of the semiconductor chip 2 are respectively connected to the internal connection regions 13 of the interconnection patterns 7 through the wires 3. Subsequently, the semiconductor chip 2 and the wires 3 are sealed in the resin sealer 4, and an unnecessary portion of the interconnection member 1 is trimmed. Finally, solder bumps are formed on the external connection regions 10 to form the external connection terminals 9. Thus, the semiconductor device is completed.

The construction of the interconnection member 1 according to Embodiment 3 is different from that in Embodiment 1. In Embodiment 1, the insulator 8 is formed on the adhesive layer 7a covering the substrate 1 formed with the interconnection patterns 7. Embodiment 3 does not employ the adhesive layer 7a and the insulator 8.

In Embodiment 1, the surface of the insulator 8 to be bonded to the semiconductor chip 2 is flat and smooth. Therefore, the flatness requirement for the bonding is satisfied, and the adhesive paste applied on the insulator 8 readily spread thereover. Since the insulator 8 is present on the interconnection patterns 7, the die-bonding adhesive layer 8a may be formed of any suitable adhesive, whether it is conductive or nonconductive. Where the interconnection member 1 according to Embodiment 1 is used, however, a certain component of the adhesive layer 7a may be vaporized to expand when the semiconductor device is subjected to a heat treatment, thereby swelling the adhesive layer 7a. Therefore, caution is required for the selection of the adhesive to be used for the adhesive layer 7a or for the treatment of the semiconductor device.

On the contrary, Embodiment 3 does not suffer from the swelling of the adhesive layer in the interconnection member 1 like Embodiment 1 does, though it is necessary to prevent the interconnection patterns 7 from directly contacting the semiconductor chip 2 when the semiconductor chip 2 is bonded to the interconnection member 1. In addition, the cost of the interconnection member 1 can be reduced because Embodiment 3 does not employ the adhesive layer 7a and the insulator 8.

Embodiment 4

Figure 14:
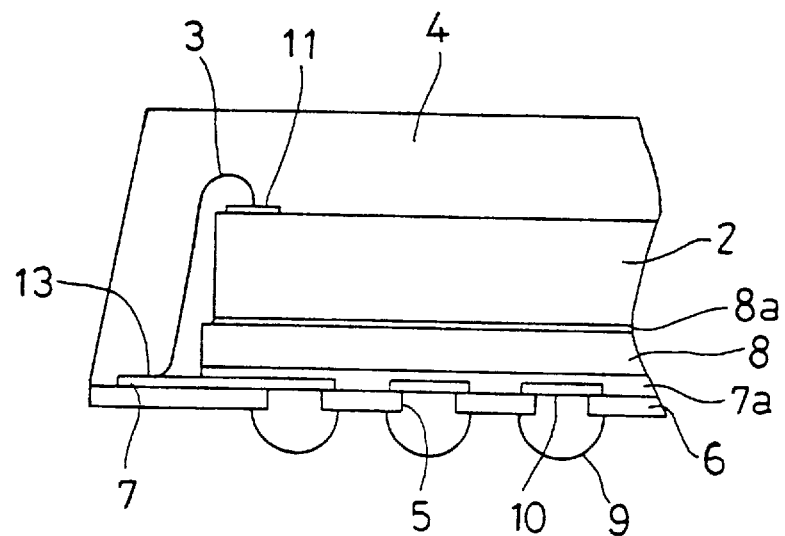
FIG. 14 is a detailed partial view illustrating the construction of a semiconductor device according to Embodiment 4 of the present invention.

FIG. 14 is a detailed partial view illustrating the construction of a semiconductor device according to Embodiment 4 of the present invention.

FIG. 14 corresponds to FIG. 3 which illustrates Embodiment 1. The semiconductor device according to Embodiment 4 has substantially the same construction as in Embodiment 1 shown in FIG. 3, except that the edges of the interconnection patterns 7, the adhesive layer 7a and the insulator 8 are all confined in the resin sealer 4. With this arrangement, when the unnecessary portion of the interconnection member 1 is trimmed along the periphery of the resin sealer 4, the interconnection patterns 7, the adhesive layer 7a and the insulator 8 of the obtained product are not exposed on the cut faces.

This arrangement prevents the interconnection patterns 7 from being exposed to an exterior environment, thereby preventing the intrusion of moisture into the semiconductor device.

Embodiment 5

Figure 15:
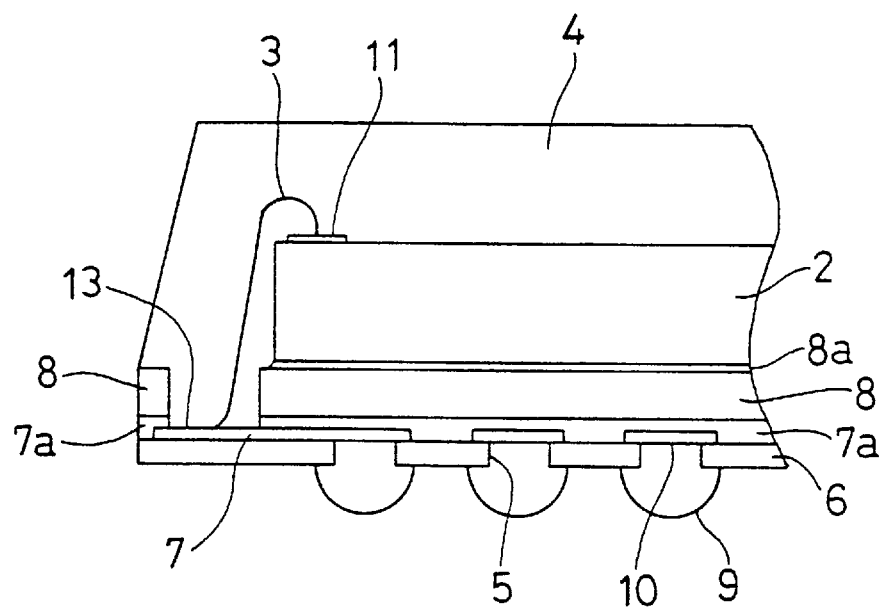
FIG. 15 is a detailed partial view illustrating the construction of a semiconductor device according to Embodiment 5 of the present invention.

FIG. 15 is a detailed partial view illustrating the construction of a semiconductor device according to Embodiment 5 of the present invention. The semiconductor device according to Embodiment 5 has substantially the same construction as in Embodiment 4 shown in FIG. 14, except that the adhesive layer 7a and the insulator 8 are exposed on the periphery of the semiconductor device.

More specifically, the ends of the interconnection patterns 7 are confined in the resin sealer 4 in accordance with Embodiment 5. With this arrangement, when the unnecessary portion of the interconnection member 1 is trimmed along the periphery of the resin sealer 4, the interconnection patterns 7 of the obtained product are not exposed on the cut faces. This arrangement also prevents the interconnection patterns from being exposed to an exterior environment, thereby preventing the intrusion of moisture into the semiconductor device.

Embodiment 6

Figure 16:
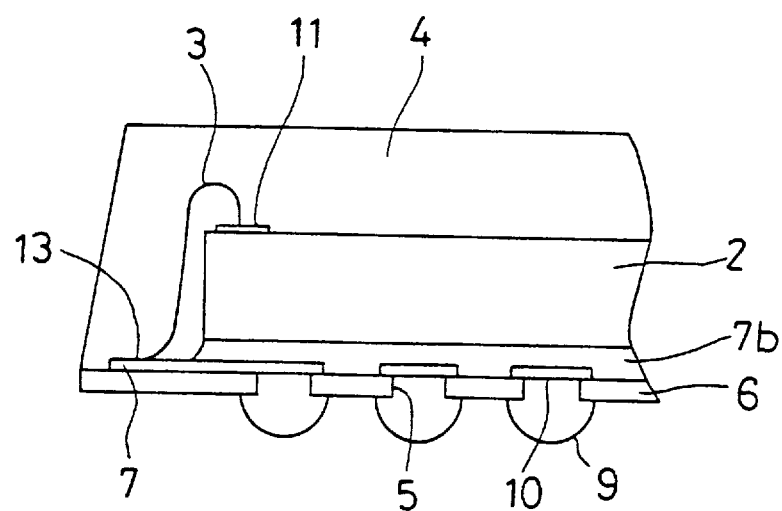
FIG. 16 is a detailed partial view illustrating the construction of a semiconductor device according to Embodiment 6 of the present invention.

FIG. 16 is a detailed partial view illustrating the construction of a semiconductor device according to Embodiment 6 of the present invention.

FIG. 16 corresponds to FIG. 13 which illustrates Embodiment 3. The semiconductor device according to Embodiment 6 has substantially the same construction as in Embodiment 3 shown in FIG. 13, except that the ends of the interconnection patterns 7 are confined in the resin sealer 4. With this arrangement, when the unnecessary portion of the interconnection member 1 is trimmed along the periphery of the resin sealer 4, the interconnection patterns 7 of the obtained product are not exposed on the cut faces, like Embodiments 4 and 5. Thus, the same effect as in Embodiments 4 and 5 can be ensured.

Embodiment 7

Figure 17:
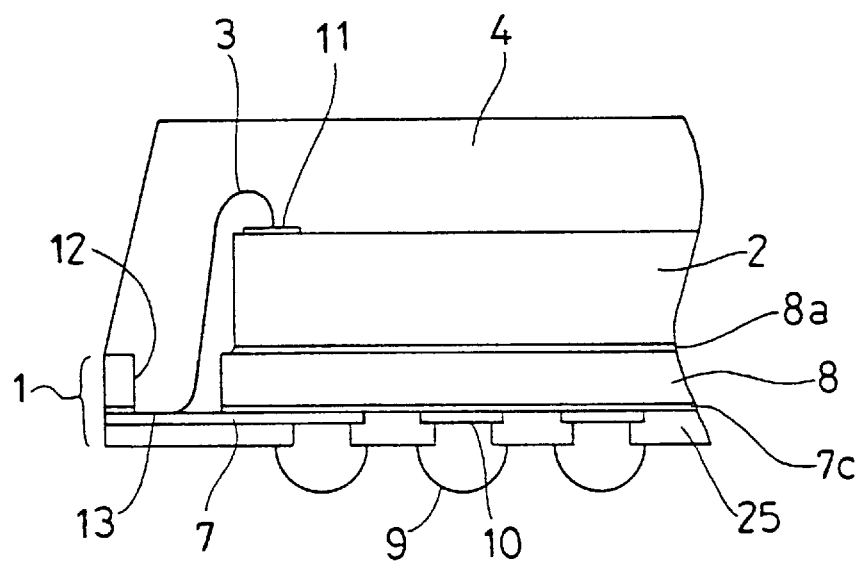
FIG. 17 is a detailed partial view illustrating the construction of a semiconductor device according to Embodiment 7 of the present invention.

FIG. 17 is a detailed partial view illustrating the construction of a semiconductor device according to Embodiment 7 of the present invention.

In accordance with this embodiment, the interconnection member 1 basically includes an insulator 8 serving as the chip-side insulating layer, an exterior insulator 25 serving as the exterior insulating layer, and interconnection patterns 7 interposed between the insulator 8 and the exterior insulator 25.

In this embodiment, the interconnection member 1 is prepared by following the process steps in Embodiment 1 in the reverse order. More specifically, the interconnection patterns 7 are formed on a lower side of the insulator 8 with intervention of a pattern adhesive layer 7c, and then the exterior insulator 25 is formed on the interconnection patterns 7 in an area excluding external connection regions 10 thereof. Thereafter, external connection terminals 9 are formed on the external connection regions 10. Thus, the interconnection member 1 is prepared. Therefore, the interconnection member 1 basically has a sandwich structure such that the interconnection patterns 7 are held between the insulator 8 and the exterior insulator 25.

In accordance with this embodiment, the insulator 8 is disposed between the semiconductor chip 2 and the interconnection patterns 7. Where the semiconductor chip 2 is to be bonded onto the interconnection patterns 7 with intervention of an insulating resin layer 7b similarly to Embodiment 3 shown in FIG. 13, the semiconductor chip 2 is pressed against the interconnection member 1 for the bonding thereof. This may damage portions of the interconnection patterns 7 not covered with the exterior insulator 25 (the exterior connection regions 10 to be formed with the exterior connection terminals 9), causing cracks or a like inconvenience in the interconnection patterns 7.

The construction according to Embodiment 7, however, prevents the damage to the interconnection patterns 7 and the occurrence of the aforesaid inconvenience, because the insulator 8 is present on the interconnection patterns 7.

Unlike Embodiment 3, land portions of the interconnection patterns 7 at which the external connection terminals 9 are to be formed (or the external connection regions 10 to be formed with the external connection terminals 9 and regions therearound) are stably fixed by the insulator 8. Therefore, the overlap areas (or peripheral areas) of the land portions which overlap with the exterior insulator 25 (corresponding to the substrate 6 in FIG. 13) on a side thereof formed with the exterior connection terminals 9 can be reduced. As a result, the areas of the land portions of the interconnection patterns 7 can be reduced. This is advantageous in that a flexible layout of the interconnection patterns 7 can be realized.

Figure 18A:
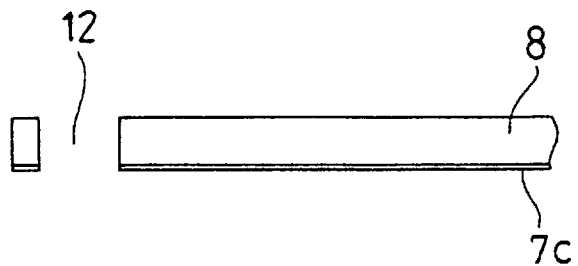
FIGS. 18(*a*) to 18(*c*) are diagrams for explaining a process for fabricating the semiconductor device of Embodiment 7.
Figure 18B:
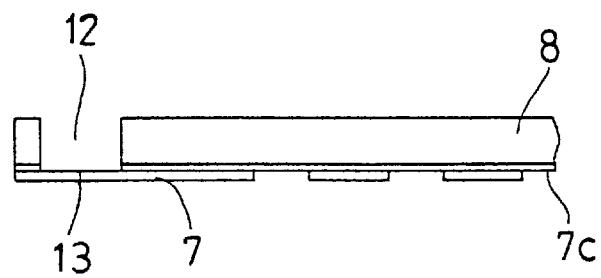
Figure 18C:
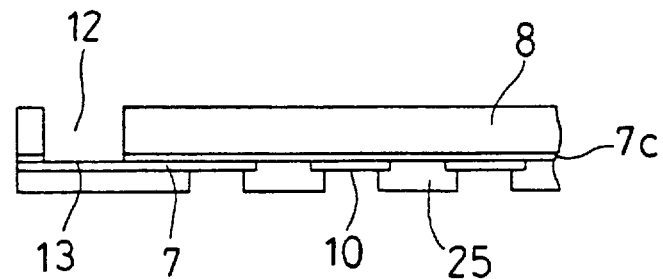

FIGS. 18(*a*) to 18(*c*) are diagrams for explaining a process for fabricating the semiconductor device of Embodiment 7.

In this embodiment, the pattern adhesive layer 7c is first formed on a lower surface of the insulator 8 of a polyimide resin or the like, and then windows 12 are formed in the pattern adhesive layer 7c and the insulator 8 by stamping (see FIG. 18(*a*)).

In turn, a metal film is bonded to the pattern adhesive layer 7c on the entire lower surface of the insulator 8, and then patterned to form metal interconnection patterns 7 (see FIG. 18(*b*)). The external insulator 25 of a polyimide resin or the like serving as the exterior insulating layer is formed on a surface portion of the resulting interconnection member 1 except terminal formation points of the interconnection patterns 7 where the external connection terminals 9 are to be formed (see FIG. 18(*c*)).

In the interconnection member 1 thus prepared, internal connection regions 13 of the interconnection patterns 7 are exposed through the windows 12 of the insulator 8, and external connection regions 10 of the interconnection patterns 7 are exposed through openings (terminal formation points) of the insulator 8. The semiconductor device using the interconnection member 1 thus prepared is fabricated in the same manner as the fabrication process shown in FIGS. 7(*a*) to 7(*e*), 11(*f*) and 11(*g*).

Embodiment 8

Figure 19:
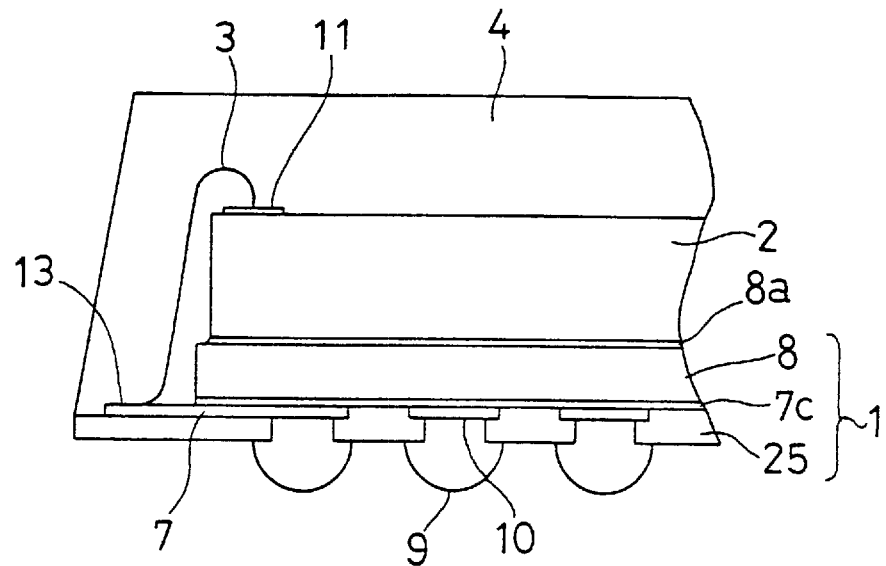
FIG. 19 is a detailed partial view illustrating the construction of a semiconductor device according to Embodiment 8 of the present invention.

FIG. 19 is a detailed partial view illustrating the construction of a semiconductor device according to Embodiment 8 of the present invention, in which interconnection patterns 7 are not exposed on the periphery thereof.

FIG. 19 corresponds to FIG. 17 which illustrates Embodiment 7. The semiconductor device according to Embodiment 8 has substantially the same construction as in Embodiment 7 shown in FIG. 17, except that the ends of the interconnection patterns 7, the pattern adhesive layer 7c and the insulator 8 are confined in the resin sealer 4. With this arrangement, when the unnecessary portion of the interconnection member 1 is trimmed along the periphery of the resin sealer 4, the interconnection patterns 7, pattern adhesive layer 7c and insulator 8 of the obtained product are not exposed on the cut faces.

This arrangement prevents the interconnection patterns 7 from being exposed to an exterior environment, thereby preventing the intrusion of moisture into the semiconductor device.

Embodiment 9

Figure 20:
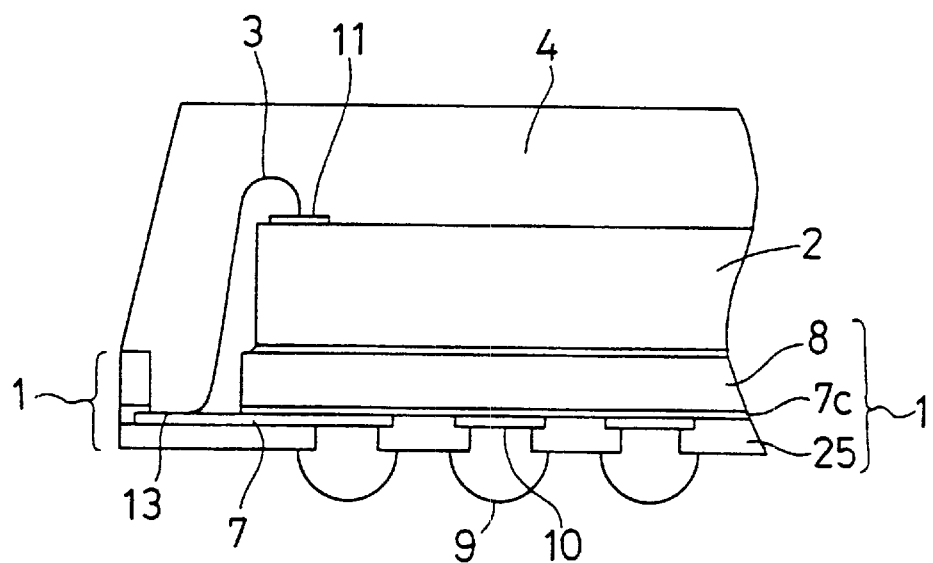
FIG. 20 is a detailed partial view illustrating the construction of a semiconductor device according to Embodiment 9 of the present invention.
Figure 21:
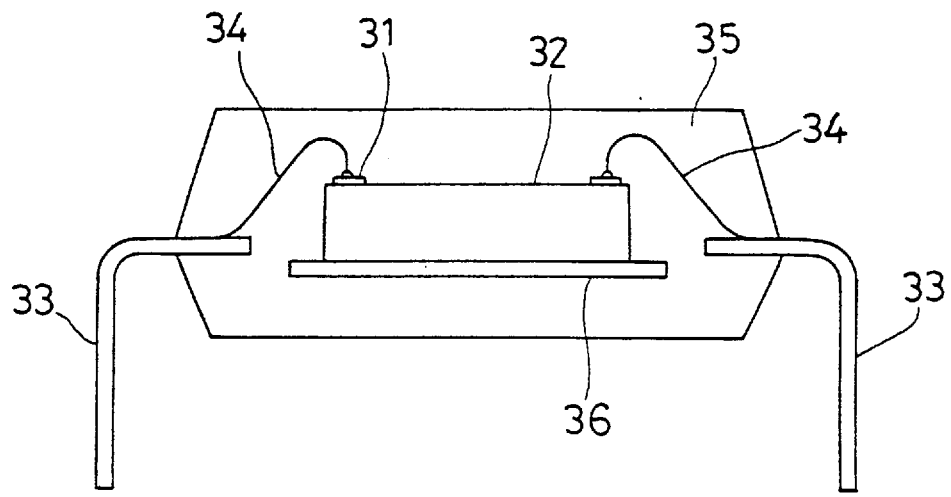
FIG. 21 is a sectional view illustrating a conventional semiconductor device of the most common construction.
Figure 22:
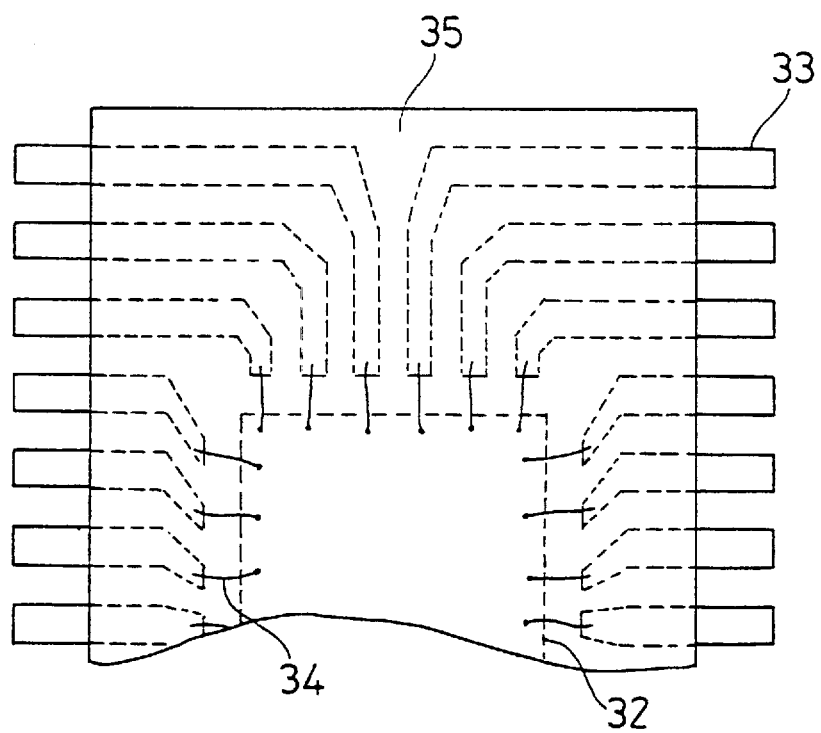
FIG. 22 is a plan view of the conventional semiconductor device shown in FIG. 21.
Figure 23:
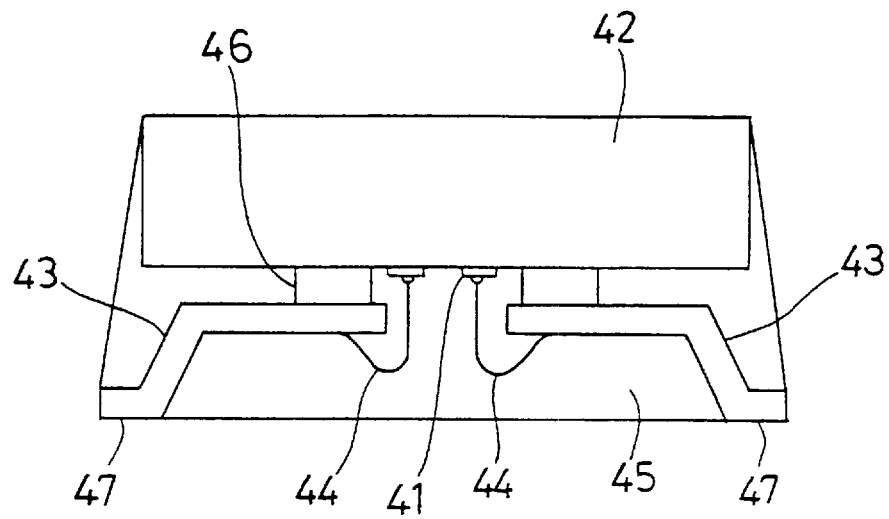
FIG. 23 is a diagram illustrating the construction of a conventional downsized semiconductor device of a first type.
Figure 24:
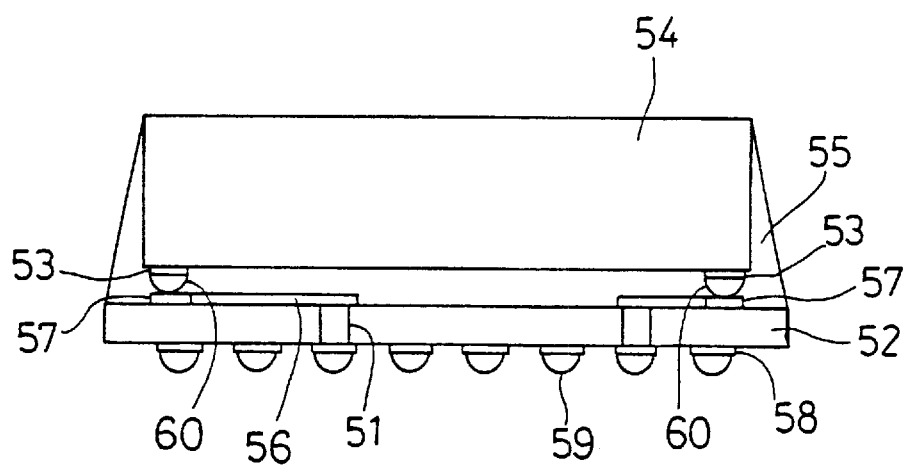
FIG. 24 is a diagram illustrating the construction of a conventional downsized semiconductor device of a second type.
Figure 25:
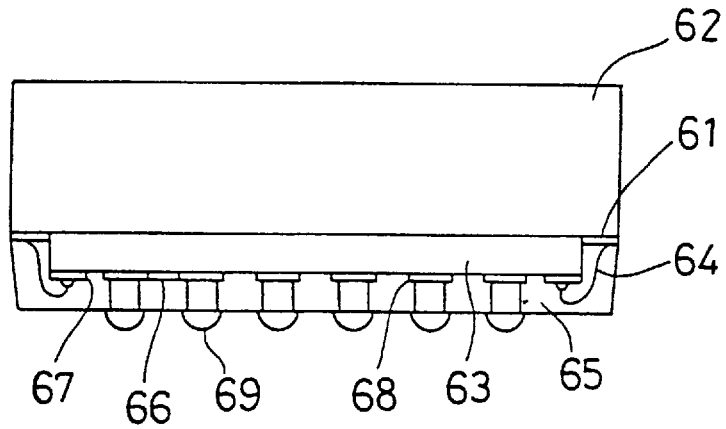
FIG. 25 is a diagram illustrating the construction of a conventional downsized semiconductor device of a third type.
Figure 26:
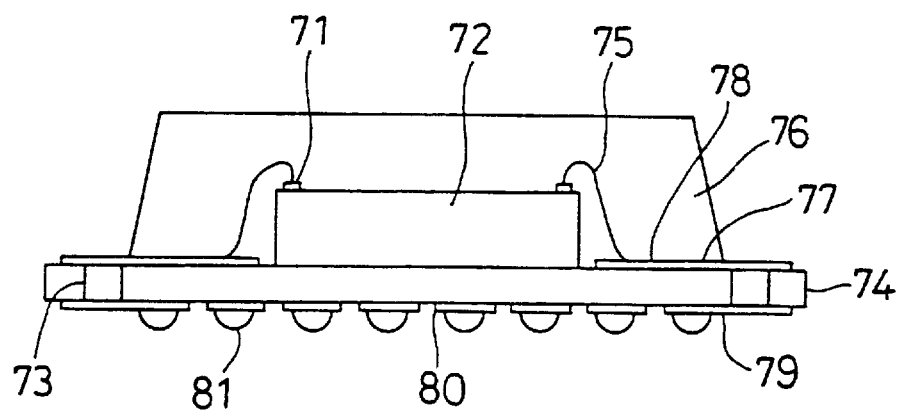
FIG. 26 is a diagram illustrating a conventional downsized semiconductor device of another construction.
Figure 27:
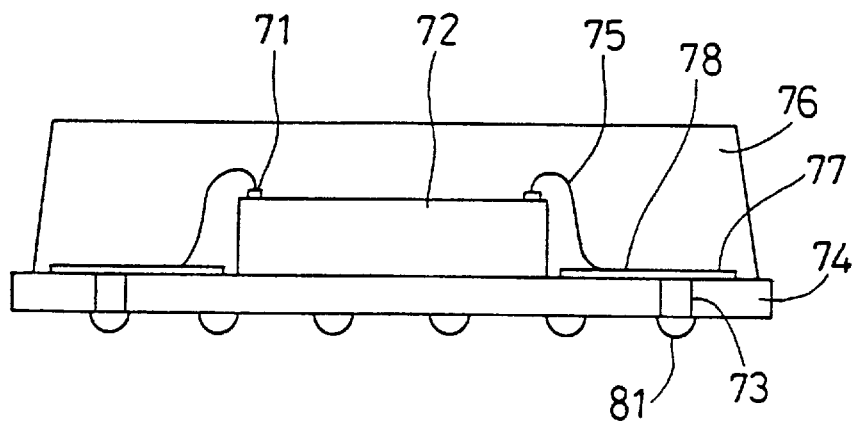
FIG. 27 is a diagram illustrating a conventional downsized semiconductor device of still another construction.

FIG. 20 is a detailed partial view illustrating the construction of a semiconductor device according to Embodiment 9 of the present invention. The semiconductor device according to Embodiment 9 has substantially the same construction as in Embodiment 8 shown in FIG. 19, except that the interconnection patterns 7 are not exposed on the periphery thereof but the pattern adhesive layer 7c and the insulator 8 are exposed on the periphery thereof.

More specifically, the ends of the interconnection patterns 7 are confined in the resin sealer 4. With this arrangement, when the unnecessary portion of the interconnection member 1 is trimmed along the periphery of the resin sealer 4, the interconnection patterns 7 of the obtained product are not exposed on the cut faces. This arrangement prevents the interconnection patterns 7 from being exposed to an exterior environment, thereby preventing the intrusion of moisture into the semiconductor device.

In the semiconductor device of the present invention, the electrodes of the semiconductor chip and the interconnection member is connected through the wires, and the interconnection member and the external connection terminals are provided on a side of the semiconductor chip opposite to the side thereof formed with the electrodes. The semiconductor device has a novel construction such that the external connection terminals are arranged in an area array within an area inward from the wire connection points on the interconnection member or within an area the boundary of which is outwardly spaced 1 mm apart from the periphery of the semiconductor chip, and the lengths of the wires are minimized by reducing the thickness of the semiconductor chip.

With this arrangement, the semiconductor device has a reduced size substantially equivalent to the size of the semiconductor chip. Since the semiconductor device employs the wires for connecting the electrodes of the semiconductor chip to the interconnection members, this construction can be readily applied to semiconductor chips having different electrode layout designs. Further, since the external connection terminals are arranged in an area array, this construction can be readily applied to semiconductor chips having a multiplicity of electrodes. Thus, the advantages in the prior art are maintained in the present invention.

In addition, the semiconductor device of the present invention offers an advantage such that no limitation is posed on the layout of the external connection terminals within the semiconductor chip area. Thus, the semiconductor device of the present invention has a reduced size, and is highly reliable and free from the problems in the prior art. Further, the semiconductor device has a construction such that the production of resin dust during the resin sealing can be prevented. Therefore, an operational trouble in the production line rarely occurs due to the resin dust.

Where the insulating film is used for the bonding of the semiconductor chip and the interconnection member, the thermosetting resin adhesive is not required, which is used in the prior art. Thus, the thickness of the semiconductor device can be reduced by the thickness of the adhesive, and the production cost can be reduce.

An improved fixation of the resin sealer to the interconnection member prevents the resin sealer from being cracked. Where the interconnection member has the small holes formed in the insulating substrate, a certain vaporized component can be released from the holes so that the vaporized component is prevented from expanding at the bonding interface between the insulating substrate of the interconnection member and the adhesive layer or the like during a reflow process. In addition, since the linear expansion coefficient of the resin sealer is proximate to the linear expansion coefficients of the materials for the interconnection member and the thickness of the resin sealer provided on the semiconductor chip is proximate to the thickness of the interconnection member, the warpage of the semiconductor device can be minimized for facilitation of mount implementation.

In accordance with the present invention, the major portions of the interconnection patterns and the external connection terminals are provided within an area inward from the internal connection regions of the interconnection plate. Thus, the major portions of the interconnection patterns and the external connection terminals can be disposed under the semiconductor chip. Therefore, the interconnection plate has a reduced size which is substantially equivalent to the size of the semiconductor chip, so that the size of the semiconductor device can be reduced. Further, since the interconnection patterns are of a single layer, the thickness of the semiconductor device can be reduced and the cost of the semiconductor device can be reduced.

The invention being thus described, it will be obvious that the same may be varied in many ways. Such variations are not to be regarded as a departure from the spirit and the scope of the invention, and all such modification as would be obvious to those skilled in the art are intended to fall within the scope of the following claims.

What is claimed is:

1. A semiconductor device comprising:
    an interconnection plate including an external insulating layer, an adhesive chip-side insulating layer, a single layer of interconnection patterns sandwiched between and in contact with the external insulating layer and the chip-side insulating layer, and external connection terminals provided on the external insulating layer and respectively connected to the interconnection patterns, wherein portions of the interconnection patterns are exposed through an aperture in the chip-side insulating layer to form internal connection regions;
    a semiconductor chip having electrodes formed on one surface thereof, and bonded directly to the chip-side insulating layer of the interconnection plate with the other surface thereof;
    wires respectively connecting the electrodes of the semiconductor chip and the internal connection regions; and
    a resin sealer sealing therein the semiconductor chip and the wires on the interconnection plate, wherein the resin sealer forms a chip package having a perimeter slightly beyond a perimeter of the chip,
    wherein the internal connection regions are provided in a peripheral area of the interconnection plate surrounding the semiconductor chip, and major portions of the interconnection patterns and the external connection terminals are provided in an area inward from the internal connection regions under the semiconductor chip.

2. A semiconductor device as set forth in claim 1, wherein the chip-side insulating layer of the interconnection plate is formed of a thermosetting resin, and the semiconductor chip is bonded to the interconnection plate by heating the thermosetting resin.

3. A semiconductor device as set forth in claim 1, wherein the chip-side insulating layer of the interconnection plate is an insulating adhesive.

4. A semiconductor device comprising:
    an interconnection plate including an external insulating layer a chip-side insulating layer, interconnection patterns provided between the external insulating layer and the chip-side insulating layer, and external connection terminals provided on the external insulating layer and respectively connected to the interconnection patterns, portions of the interconnection patterns being exposed on a side of the chip-side insulating layer to form internal connection regions;
    a semiconductor chip having electrodes formed on one surface thereof, and bonded to the chip-side insulating layer of the interconnection plate with the other surface thereof;
    wires respectively connecting the electrodes of the semiconductor chip and the internal connection regions; and
    a resin sealer sealing therein the semiconductor chip and the wires on the interconnection plate.
    wherein the internal connection regions are provided in a peripheral area of the interconnection plate surrounding the semiconductor chip, and major portions of the interconnection patterns and the external connection terminals are provided in an area inward from the internal connection regions under the semiconductor chip
    wherein the internal connection regions are formed by removing portions of the chip-side insulating layer in an inverted-wedge shape such that the width of a resulting recess on each of the internal connection regions is gradually narrowed from the bottom to the mouth thereof, whereby the recess of the inverted-wedge shape is filled with a resin to improve fixation of the resin to the interconnection plate by an anchoring effect.

5. A semiconductor device as set forth in claim 1, wherein the external insulating layer of the interconnection plate has small holes through which a vaporized component in the interconnection plate is released to be prevented from expanding at a bonding interface in the interconnection plate.

6. A semiconductor device as set forth in claim 1, wherein the interconnection patterns of the interconnection plate are formed within an area inwardly spaced from the periphery of the external insulating layer, whereby the interconnection patterns are not exposed on the periphery of the semiconductor device between the resin sealer and the external insulating layer.

7. A process for fabricating a semiconductor device, comprising the steps of:

forming through-holes in an external insulating layer, then forming a single layer of interconnection patterns on the external insulating layer, and covering the interconnection patterns with an adhesive chip-side insulating layer to prepare an interconnection plate having the interconnection patterns sandwiched between and in contact with the chip-side insulating layer and the external insulating layer;

exposing portions of the interconnection patterns of the interconnection plate on a peripheral portion of the chip-side insulating layer to form internal connection regions;

bonding a semiconductor chip having electrodes formed on one surface thereof directly to the chip-side insulating layer of the interconnection plate with the other surface of the semiconductor chip brought in contact with a surface portion of the chip-side insulating layer inward from the internal connection regions;

respectively connecting the electrodes of the semiconductor chip and the internal connection regions through wires;

sealing the semiconductor chip and the wires in a resin on the chip-side insulating layer of the interconnection plate to form a chip package having a perimeter slightly beyond a perimeter of the chip; and forming external connection terminals on terminal formation points of the interconnection patterns exposed through the through-holes of the external insulating layer, wherein major portions of the interconnection patterns and the external connection terminals are provided within an area inward from the internal connection regions under the semiconductor chip.

8. A process for fabricating a semiconductor device, comprising the steps of:

forming windows in a peripheral portion of an adhesive chip-side insulating layer, then forming a single layer of interconnection patterns on the chip-side insulating layer, and covering with an external insulating layer the interconnection patterns except terminal formation points on which external connection terminals are to be formed, to prepare an interconnection plate having the interconnection patterns sandwiched between and in contact with the chip-side insulating layer and the external insulating layer;

allowing portions of the interconnection patterns of the interconnection plate exposed through the windows of the chip-side insulating layer to serve as internal connection regions;

bonding a semiconductor chip having electrodes formed on one surface thereof directly to the chip-side insulating layer with the other surface of the semiconductor chip inward from the windows formed therein;

respectively connecting the electrodes of the semiconductor chip and the internal connection regions through wires;

sealing the semiconductor chip and the wires in a resin on the chip-side insulating layer of the interconnection plate to form a chip package having a perimeter slightly beyond a perimeter of the chip; and forming external connection terminals on the terminal formation points exposed from the external insulating layer of the interconnection plate, wherein major portions of the interconnection patterns and the external connection terminals are provided within an area inward from the internal connection regions under the semiconductor chip.

9. A process as set forth in claim 7, wherein during the step of sealing the semiconductor chip and the wires in a resin, a parting face of a mold for the resin is prevented from overhanging the internal connection regions when the internal connection plate is set in the mold.

10. A process as set forth in claim 8, wherein during the step of sealing the semiconductor chip and the wires in a resin, a parting face of a mold for the resin is prevented from overhanging the internal connection regions when the internal connection plate is set in the mold.

11. A semiconductor device comprising:

a three-layer interconnection member having a first external insulating layer, a second chip-side insulating layer, and a third conductive interconnection pattern layer sandwiched between and in contact with the external insulating layer and the chip-side insulating layer, where the interconnection pattern layer includes at least one external connection region aligned with holes through the external insulating layer, and at least one internal connection region aligned with holes through the chip-side insulating layer;

a semiconductor chip bonded on at least one side directly to the chip-side insulating layer of the interconnection member and having electrodes on a side of the chip opposite to the chip-side insulating layer, where the chip is positioned on the interconnection member within an perimeter defined by the external connection region, and the external connection terminals are under the semiconductor chip;

wires connecting the electrodes of the chip to the internal connection regions of the interconnection member, and a resin sealer covering the semiconductor chip and covering the holes in the chip-side insulating layer to form a chip packing having a perimeter slightly beyond a perimeter of the chip.

12. A method for fabricating a semiconductor device, comprising the steps of:

a. forming a three-layered interconnection member by:

a.1 creating through-holes in an external insulating layer, a.2 forming a conductive interconnection pattern on the external insulating layer, and a.3 coating the conductive interconnection pattern with a chip-side insulating layer to sandwich the interconnection pattern between the chip-side insulating layer and the external insulating layer;

b. exposing an internal connection region of the conductive interconnection pattern by creating holes in the chip-side insulating layer;

c. bonding a semiconductor chip directly to the chip-side insulating layer to a region of the chip-side insulating layer inward from the internal connection region, where the chip has electrodes on a surface other than a surface bonded to the insulating layer;

d. connecting conducting wires to the electrodes of the semiconductor chip and the internal connection region;

e. sealing the semiconductor chip and the wires in a resin on the chip-side insulating layer of the interconnection plate, were the resin flows into the holes of the chip-side insulating layer and the resin forms a chip package having a perimeter slightly beyond a perimeter of the chip; and f. forming external connection terminals on the external insulating layer and beneath the semiconductor chip, where the terminals are connected to the interconnection pattern through the through-holes of the external insulating layer.

13. A method for fabricating a semiconductor device, comprising the steps of:
   a. forming a three-layered interconnection member by:
      a.1 creating through-holes in an external insulating layer,
      a.2 forming a conductive interconnection pattern on the external insulating layer, and
      a.3 coating the conductive interconnection pattern with a chip-side insulating layer to sandwich the interconnection pattern between the chip-side insulating layer and the external insulating layer;
   b. exposing an internal connection region of the conductive interconnection pattern by creating openings in the chip-side insulating layer, wherein the openings are wide at a side of the chip-side insulating layer adjacent the interconnection pattern and narrow at an opposite side of the chip-side insulating layer;
   c. bonding a semiconductor chip directly to the chip-side insulating layer to a region of the chip-side insulating layer inward from the internal connection region, where the chip has electrodes on a surface opposite to a surface bonded to the insulating layer;
   d. connecting conducting wires to the electrodes of the semiconductor chip and the internal connection region;
   e. sealing the semiconductor chip and the wires in a resin on the chip-side insulating layer of the interconnection plate to form a chip package having a perimeter slightly beyond a perimeter of the chip, were the resin flows into the openings of the chip-side insulating layer and the resin is anchored to the chip-side insulating layer by the wide to narrow shape of the openings; and
   f. forming external connection terminals on the external insulating layer and beneath the semiconductor chip, where the terminals are connected to the interconnection pattern through the through-holes of the external insulating layer.

14. A semiconductor device as in claim 1 wherein the distance between the perimeter of the semiconductor chip and the perimeter of the package is not greater than 1.0 mm, when the package and chip are viewed in plan.

15. A process for fabricating a semiconductor device as in claim 7 wherein the distance between the perimeter of the semiconductor chip and the perimeter of the package is not greater than 1.0 mm, when the package and chip are viewed in plan.

16. A process for fabricating a semiconductor device as in claim 8 wherein the distance between the perimeter of the semiconductor chip and the perimeter of the package is not greater than 1.0 mm, when the package and chip are viewed in plan.

17. A semiconductor device as in claim 11 wherein the perimeter of the package extends beyond the perimeter of the chip by a distance of no greater than 1.0 mm.

18. A method for fabricating a semiconductor device as in claim 12 wherein the perimeter of the package extends beyond the perimeter of the chip by a distance of no greater than 1.0 mm.

19. A method for fabricating a semiconductor device as in claim 13 wherein the perimeter of the package extends beyond the perimeter of the chip by a distance of no greater than 1.0 mm.

* * * * *